United States Patent
Raring et al.

(10) Patent No.: US 11,121,522 B1
(45) Date of Patent: Sep. 14, 2021

(54) FACET ON A GALLIUM AND NITROGEN CONTAINING LASER DIODE

(71) Applicant: KYOCERA SLD Laser, Inc., Goleta, CA (US)

(72) Inventors: James W. Raring, Goleta, CA (US); Hua Huang, Fremont, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

(21) Appl. No.: 15/789,413

(22) Filed: Oct. 20, 2017

Related U.S. Application Data

(63) Continuation of application No. 15/153,554, filed on May 12, 2016, now Pat. No. 9,800,016, which is a continuation-in-part of application No. 13/850,187, filed on Mar. 25, 2013, now Pat. No. 9,343,871.

(60) Provisional application No. 61/620,648, filed on Apr. 5, 2012.

(51) Int. Cl.
| | |
|---|---|
| *H01S 5/028* | (2006.01) |
| *H01S 5/02* | (2006.01) |
| *H01S 5/042* | (2006.01) |
| *H01S 5/343* | (2006.01) |
| *H01S 5/32* | (2006.01) |
| *H01S 5/22* | (2006.01) |
| *H01S 5/20* | (2006.01) |

(52) U.S. Cl.
CPC ......... *H01S 5/0287* (2013.01); *H01S 5/0203* (2013.01); *H01S 5/0282* (2013.01); *H01S 5/0425* (2013.01); *H01S 5/34333* (2013.01); *H01S 5/2009* (2013.01); *H01S 5/22* (2013.01); *H01S 5/3202* (2013.01); *H01S 2304/04* (2013.01)

(58) Field of Classification Search
CPC ...... H01S 5/028; H01S 5/0287; H01S 5/0281; H01S 5/0282; H01S 5/0288; H01S 5/34333
See application file for complete search history.

(56) References Cited

U.S. PATENT DOCUMENTS

| | | | |
|---|---|---|---|
| 4,318,058 A | 3/1982 | Mito et al. | |
| 4,341,592 A | 7/1982 | Shortes et al. | |
| 4,563,368 A | 1/1986 | Tihanyi et al. | |
| 4,860,687 A | 8/1989 | Frijlink | |
| 4,911,102 A | 3/1990 | Manabe et al. | |

(Continued)

FOREIGN PATENT DOCUMENTS

| | | |
|---|---|---|
| CN | 1538534 | 10/2004 |
| CN | 1702836 | 11/2005 |

(Continued)

OTHER PUBLICATIONS

Hashimoto, "High-power 2.8 W blue violet laser diode for white light source", 2012, Optical Review, vol. 19, No. 6, pp. 412-414.*

(Continued)

*Primary Examiner* — Michael Carter
(74) *Attorney, Agent, or Firm* — Kilpatrick Townsend & Stockton LLP

(57) ABSTRACT

Laser diode technology incorporating etched facet mirror formation and optical coating techniques for reflectivity modification to enable ultra-high catastrophic optical mirror damage thresholds for high power laser diodes.

20 Claims, 15 Drawing Sheets

(56) References Cited

U.S. PATENT DOCUMENTS

| | | | |
|---|---|---|---|
| 5,144,634 A * | 9/1992 | Gasser | H01S 5/028 372/49.01 |
| 5,331,654 A | 7/1994 | Jewell et al. | |
| 5,334,277 A | 8/1994 | Nakamura | |
| 5,527,417 A | 6/1996 | Iida et al. | |
| 5,546,418 A | 8/1996 | Ishibashi et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,821,555 A | 10/1998 | Saito et al. | |
| 5,888,907 A | 3/1999 | Tomoyasu et al. | |
| 5,951,923 A | 9/1999 | Horie et al. | |
| 6,069,394 A | 5/2000 | Hashimoto et al. | |
| 6,072,197 A | 6/2000 | Horino et al. | |
| 6,153,010 A | 11/2000 | Kiyoku et al. | |
| 6,195,381 B1 | 2/2001 | Botez et al. | |
| 6,379,985 B1 | 4/2002 | Cervantes et al. | |
| 6,451,157 B1 | 9/2002 | Hubacek | |
| 6,618,409 B1 * | 9/2003 | Hu | H01L 33/44 372/43.01 |
| 6,639,925 B2 | 10/2003 | Niwa et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,858,882 B2 | 2/2005 | Tsuda et al. | |
| 6,920,166 B2 | 7/2005 | Akasaka et al. | |
| 7,001,577 B2 | 2/2006 | Zimmerman et al. | |
| 7,009,199 B2 | 3/2006 | Hall | |
| 7,019,325 B2 | 3/2006 | Li et al. | |
| 7,026,756 B2 | 4/2006 | Shimizu et al. | |
| 7,033,858 B2 | 4/2006 | Chai et al. | |
| 7,053,413 B2 | 5/2006 | D'Evelyn et al. | |
| 7,128,849 B2 | 10/2006 | Setlur et al. | |
| 7,303,630 B2 | 12/2007 | Motoki et al. | |
| 7,312,156 B2 | 12/2007 | Granneman et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike et al. | |
| 7,555,025 B2 | 6/2009 | Yoshida | |
| 7,598,104 B2 | 10/2009 | Teng et al. | |
| 7,691,658 B2 | 4/2010 | Kaeding et al. | |
| 7,709,284 B2 | 5/2010 | Iza et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,044,412 B2 | 10/2011 | Murphy et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,254,425 B1 | 8/2012 | Raring | |
| 8,259,769 B1 | 9/2012 | Raring et al. | |
| 8,284,810 B1 | 10/2012 | Sharma et al. | |
| 8,294,179 B1 | 10/2012 | Raring | |
| 8,314,429 B1 | 11/2012 | Raring et al. | |
| 8,350,273 B2 | 1/2013 | Vielemeyer | |
| 8,351,478 B2 | 1/2013 | Raring et al. | |
| 8,355,418 B2 | 1/2013 | Raring et al. | |
| 8,427,590 B2 | 4/2013 | Raring et al. | |
| 8,451,876 B1 | 5/2013 | Raring et al. | |
| 8,964,807 B1 * | 2/2015 | McLaurin | H01S 5/2205 257/101 |
| 9,343,871 B1 | 5/2016 | Raring et al. | |
| 9,800,016 B1 | 10/2017 | Raring et al. | |
| 2001/0048114 A1 | 12/2001 | Morita et al. | |
| 2002/0027933 A1 | 3/2002 | Tanabe et al. | |
| 2002/0085603 A1 | 7/2002 | Okumura | |
| 2002/0105986 A1 | 8/2002 | Yamasaki | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0140846 A1 | 7/2003 | Biwa et al. | |
| 2003/0141499 A1 | 7/2003 | Venkatraman et al. | |
| 2003/0200931 A1 | 10/2003 | Goodwin | |
| 2003/0216011 A1 | 11/2003 | Nakamura et al. | |
| 2004/0022288 A1 * | 2/2004 | Shono | B82Y 20/00 372/46.01 |
| 2004/0025787 A1 | 2/2004 | Selbrede et al. | |
| 2004/0060518 A1 | 4/2004 | Nakamura et al. | |
| 2004/0099213 A1 | 5/2004 | Adomaitis et al. | |
| 2004/0146264 A1 | 7/2004 | Auner et al. | |
| 2004/0151222 A1 | 8/2004 | Sekine | |
| 2004/0233950 A1 | 11/2004 | Furukawa et al. | |
| 2004/0238810 A1 | 12/2004 | Dwilinski et al. | |
| 2004/0247275 A1 | 12/2004 | Vakhshoori et al. | |
| 2004/0264537 A1 | 12/2004 | Jackson | |
| 2005/0040384 A1 | 2/2005 | Tanaka et al. | |
| 2005/0069246 A1 * | 3/2005 | Kato | G02B 6/136 385/18 |
| 2005/0072986 A1 | 4/2005 | Sasaoka | |
| 2005/0168564 A1 | 8/2005 | Kawaguchi et al. | |
| 2005/0214992 A1 | 9/2005 | Chakraborty et al. | |
| 2005/0218413 A1 | 10/2005 | Matsumoto et al. | |
| 2005/0224826 A1 | 10/2005 | Keuper et al. | |
| 2005/0229855 A1 | 10/2005 | Raaijmakers | |
| 2005/0230701 A1 | 10/2005 | Huang | |
| 2005/0286591 A1 | 12/2005 | Lee | |
| 2006/0033009 A1 | 2/2006 | Kobayashi et al. | |
| 2006/0060131 A1 | 3/2006 | Atanackovic | |
| 2006/0077795 A1 | 4/2006 | Kitahara et al. | |
| 2006/0078022 A1 | 4/2006 | Kozaki et al. | |
| 2006/0086319 A1 | 4/2006 | Kasai et al. | |
| 2006/0193359 A1 | 8/2006 | Kuramoto | |
| 2006/0213429 A1 | 9/2006 | Motoki et al. | |
| 2006/0216416 A1 | 9/2006 | Sumakeris et al. | |
| 2006/0256482 A1 | 11/2006 | Araki et al. | |
| 2006/0288928 A1 | 12/2006 | Eom et al. | |
| 2007/0081857 A1 | 4/2007 | Yoon | |
| 2007/0093073 A1 | 4/2007 | Farrell, Jr. et al. | |
| 2007/0101932 A1 | 5/2007 | Schowalter et al. | |
| 2007/0110112 A1 | 5/2007 | Sugiura | |
| 2007/0153866 A1 | 7/2007 | Shchegrov et al. | |
| 2007/0163490 A1 | 7/2007 | Habel et al. | |
| 2007/0184637 A1 | 8/2007 | Haskell et al. | |
| 2007/0217462 A1 | 9/2007 | Yamasaki | |
| 2007/0242716 A1 | 10/2007 | Samal et al. | |
| 2007/0259464 A1 | 11/2007 | Bour et al. | |
| 2007/0272933 A1 | 11/2007 | Kim et al. | |
| 2007/0280320 A1 | 12/2007 | Feezell et al. | |
| 2008/0029152 A1 | 2/2008 | Milshtein et al. | |
| 2008/0092812 A1 | 4/2008 | McDiarmid et al. | |
| 2008/0095492 A1 | 4/2008 | Son et al. | |
| 2008/0121916 A1 | 5/2008 | Teng et al. | |
| 2008/0124817 A1 | 5/2008 | Bour et al. | |
| 2008/0164578 A1 | 7/2008 | Tanikella et al. | |
| 2008/0173735 A1 | 7/2008 | Mitrovic et al. | |
| 2008/0181274 A1 | 7/2008 | Michiue et al. | |
| 2008/0191223 A1 | 8/2008 | Nakamura et al. | |
| 2008/0198881 A1 | 8/2008 | Farrell et al. | |
| 2008/0217745 A1 | 9/2008 | Miyanaga et al. | |
| 2008/0232416 A1 | 9/2008 | Okamoto et al. | |
| 2008/0251020 A1 | 10/2008 | Franken et al. | |
| 2008/0283851 A1 | 11/2008 | Akita | |
| 2008/0285609 A1 | 11/2008 | Ohta et al. | |
| 2008/0291961 A1 | 11/2008 | Kamikawa et al. | |
| 2008/0298409 A1 | 12/2008 | Yamashita et al. | |
| 2008/0308815 A1 | 12/2008 | Kasai et al. | |
| 2008/0315179 A1 | 12/2008 | Kim et al. | |

(56) References Cited

U.S. PATENT DOCUMENTS

| | | | |
|---|---|---|---|
| 2009/0021723 | A1 | 1/2009 | De Lega |
| 2009/0058532 | A1 | 3/2009 | Kikkawa et al. |
| 2009/0061857 | A1 | 3/2009 | Kazmi |
| 2009/0066241 | A1 | 3/2009 | Yokoyama |
| 2009/0078944 | A1 | 3/2009 | Kubota et al. |
| 2009/0080857 | A1 | 3/2009 | St. John-Larkin |
| 2009/0081857 | A1 | 3/2009 | Hanser et al. |
| 2009/0141765 | A1 | 6/2009 | Kohda et al. |
| 2009/0153752 | A1 | 6/2009 | Silverstein |
| 2009/0159869 | A1 | 6/2009 | Ponce et al. |
| 2009/0229519 | A1 | 9/2009 | Saitoh |
| 2009/0250686 | A1 | 10/2009 | Sato et al. |
| 2009/0267100 | A1 | 10/2009 | Miyake et al. |
| 2009/0273005 | A1 | 11/2009 | Lin |
| 2009/0309110 | A1 | 12/2009 | Raring et al. |
| 2009/0309127 | A1 | 12/2009 | Raring et al. |
| 2009/0310640 | A1 | 12/2009 | Sato et al. |
| 2009/0316116 | A1 | 12/2009 | Melville et al. |
| 2009/0321778 | A1 | 12/2009 | Chen et al. |
| 2010/0001300 | A1 | 1/2010 | Raring et al. |
| 2010/0006546 | A1 | 1/2010 | Young et al. |
| 2010/0006873 | A1 | 1/2010 | Raring et al. |
| 2010/0096615 | A1 | 4/2010 | Okamoto et al. |
| 2010/0140630 | A1 | 6/2010 | Hamaguchi et al. |
| 2010/0140745 | A1 | 6/2010 | Khan et al. |
| 2010/0195687 | A1 | 8/2010 | Okamoto et al. |
| 2010/0220262 | A1 | 9/2010 | DeMille et al. |
| 2010/0276663 | A1 | 11/2010 | Enya et al. |
| 2010/0295054 | A1 | 11/2010 | Okamoto et al. |
| 2010/0309943 | A1 | 12/2010 | Chakraborty et al. |
| 2010/0316075 | A1 | 12/2010 | Raring et al. |
| 2011/0031508 | A1 | 2/2011 | Hamaguchi et al. |
| 2011/0056429 | A1 | 3/2011 | Raring et al. |
| 2011/0057167 | A1 | 3/2011 | Ueno et al. |
| 2011/0064100 | A1 | 3/2011 | Raring et al. |
| 2011/0064101 | A1 | 3/2011 | Raring et al. |
| 2011/0064102 | A1 | 3/2011 | Raring et al. |
| 2011/0073888 | A1 | 3/2011 | Ueno et al. |
| 2011/0075694 | A1 | 3/2011 | Yoshizumi et al. |
| 2011/0103418 | A1 | 5/2011 | Hardy et al. |
| 2011/0129669 | A1 | 6/2011 | Fujito et al. |
| 2012/0093186 | A1* | 4/2012 | Murayama ............ B82Y 20/00 372/44.01 |

FOREIGN PATENT DOCUMENTS

| | | |
|---|---|---|
| CN | 1781195 | 5/2006 |
| CN | 101009347 | 8/2007 |
| CN | 101079463 | 11/2007 |
| CN | 101099245 | 1/2008 |
| CN | 101171692 | 4/2008 |
| JP | 03-287770 | 12/1991 |
| JP | 2007-173467 | 7/2007 |
| WO | 2004/084275 | 9/2004 |
| WO | 2008/041521 | 4/2008 |
| WO | 2010/120819 | 10/2010 |

OTHER PUBLICATIONS

Kamikawa, "Highly reliable 500 mW laser diodes with epitaxially grown AlON coating for high-density optical storage," 2009, Appl. Phys. Lett., vol. 95, p. 031106-1-031106-3.*

Hashimoto, "High power 2.8W Blue violet Laser Diode for White Light Sources," 2012, vol. 19, No. 6, 412-414. (Year: 2012).*

U.S. Appl. No. 12/481,543, Non-Final Office Action dated Jun. 27, 2011, 10 pages.

U.S. Appl. No. 12/482,440, Final Office Action dated Aug. 12, 2011, 7 pages.

U.S. Appl. No. 12/482,440, Non-Final Office Action dated Feb. 23, 2011, 6 pages.

U.S. Appl. No. 12/484,924, Final Office Action dated Oct. 31, 2011, 11 pages.

U.S. Appl. No. 12/484,924, Non-Final Office Action dated Apr. 14, 2011, 12 pages.

U.S. Appl. No. 12/491,169, Final Office Action dated May 11, 2011, 10 pages.

U.S. Appl. No. 12/491,169, Non-Final Office Action dated Oct. 22, 2010, 10 pages.

U.S. Appl. No. 12/497,289, Non-Final Office Action dated Feb. 2, 2012, 7 pages.

U.S. Appl. No. 12/497,289, Notice of Allowance dated May 22, 2012, 7 pages.

U.S. Appl. No. 12/502,058, Final Office Action dated Aug. 19, 2011, 13 pages.

U.S. Appl. No. 12/502,058, Non-Final Office Action dated Dec. 8, 2010, 15 pages.

U.S. Appl. No. 12/502,058, Notice of Allowance dated Apr. 16, 2012, 10 pages.

U.S. Appl. No. 12/502,058, Notice of Allowance dated Jul. 19, 2012, 8 pages.

U.S. Appl. No. 12/534,838, Final Office Action dated Jan. 13, 2012, 12 pages.

U.S. Appl. No. 12/534,838, Non-Final Office Action dated Mar. 20, 2012, 13 pages.

U.S. Appl. No. 12/534,838, Non-Final Office Action dated May 3, 2011, 12 pages.

U.S. Appl. No. 12/534,838, Notice of Allowance dated Jun. 8, 2012, 8 pages.

U.S. Appl. No. 12/573,820, Final Office Action dated Oct. 11, 2011, 23 pages.

U.S. Appl. No. 12/573,820, Non-Final Office Action dated Mar. 2, 2011, 19 pages.

U.S. Appl. No. 12/749,466, Final Office Action dated Feb. 3, 2012, 16 pages.

U.S. Appl. No. 12/749,466, Non-Final Office Action dated Jul. 3, 2012, 18 pages.

U.S. Appl. No. 12/749,466, Non-Final Office Action dated Jun. 29, 2011, 20 pages.

U.S. Appl. No. 12/749,466, Notice of Allowance dated Jan. 2, 2013, 8 pages.

U.S. Appl. No. 12/759,273, Final Office Action dated Jun. 26, 2012, 10 pages.

U.S. Appl. No. 12/759,273, Non-Final Office Action dated Nov. 21, 2011, 10 pages.

U.S. Appl. No. 12/762,269, Non-Final Office Action dated Oct. 12, 2011, 12 pages.

U.S. Appl. No. 12/762,269, Notice of Allowance dated Apr. 23, 2012, 8 pages.

U.S. Appl. No. 12/762,271, Final Office Action dated Jun. 6, 2012, 13 pages.

U.S. Appl. No. 12/762,271, Non-Final Office Action dated Dec. 23, 2011, 12 pages.

U.S. Appl. No. 12/762,271, Notice of Allowance dated Aug. 8, 2012, 9 pages.

U.S. Appl. No. 12/762,278, Notice of Allowance dated Nov. 7, 2011, 11 pages.

U.S. Appl. No. 12/778,718, Non-Final Office Action dated Nov. 25, 2011, 12 pages.

U.S. Appl. No. 12/778,718, Notice of Allowance dated Apr. 3, 2012, 14 pages.

U.S. Appl. No. 12/778,718, Notice of Allowance dated Jun. 13, 2012, 7 pages.

U.S. Appl. No. 12/787,343, Non-Final Office Action dated Dec. 17, 2012, 6 pages.

U.S. Appl. No. 12/787,343, Notice of Allowance dated Jun. 10, 2013, 10 pages.

U.S. Appl. No. 12/789,303, Non-Final Office Action dated Sep. 24, 2012, 20 pages.

U.S. Appl. No. 12/789,303, Notice of Allowance dated Dec. 21, 2012, 5 pages.

U.S. Appl. No. 12/859,153, Final Office Action dated Feb. 26, 2013, 24 pages.

U.S. Appl. No. 12/859,153, Non-Final Office Action dated Sep. 25, 2012, 22 pages.

(56) References Cited

OTHER PUBLICATIONS

U.S. Appl. No. 12/868,441, Final Office Action dated Dec. 18, 2012, 34 pages.
U.S. Appl. No. 12/868,441, Non-Final Office Action dated Apr. 30, 2012, 12 pages.
U.S. Appl. No. 12/868,441, Notice of Allowance dated Sep. 18, 2013, 13 pages.
U.S. Appl. No. 12/880,803, Non-Final Office Action dated Feb. 22, 2012, 9 pages.
U.S. Appl. No. 12/880,803, Notice of Allowance dated Jul. 18, 2012, 5 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 12/942,817, Non-Final Office Action dated Feb. 20, 2013, 12 pages.
U.S. Appl. No. 12/995,946, Non-Final Office Action dated Mar. 28, 2012, 18 pages.
U.S. Appl. No. 12/995,946, Non-Final Office Action dated Jan. 29, 2013, 25 pages.
U.S. Appl. No. 13/014,622, Final Office Action dated Apr. 30, 2012, 14 pages.
U.S. Appl. No. 13/014,622, Non-Final Office Action dated Nov. 28, 2011, 14 pages.
U.S. Appl. No. 13/046,565, Final Office Action dated Feb. 2, 2012, 17 pages.
U.S. Appl. No. 13/046,565, Final Office Action dated Jul. 19, 2012, 24 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 13/108,645, Notice of Allowance dated Jan. 28, 2013, 9 pages.
U.S. Appl. No. 13/114,806, Final Office Action dated Aug. 26, 2013, 22 pages.
U.S. Appl. No. 13/114,806, Non-Final Office Action dated Apr. 12, 2013, 22 pages.
U.S. Appl. No. 13/291,922, Final Office Action dated Jun. 18, 2013, 9 pages.
U.S. Appl. No. 13/291,922, Non-Final Office Action dated Feb. 20, 2013, 10 pages.
U.S. Appl. No. 13/354,639, Non-Final Office Action dated Nov. 7, 2012, 12 pages.
U.S. Appl. No. 13/354,639, Notice of Allowance dated Dec. 14, 2012, 8 pages.
U.S. Appl. No. 13/425,354, Non-Final Office Action dated Feb. 14, 2013, 13 pages.
U.S. Appl. No. 13/548,635, Non-Final Office Action dated Jun. 14, 2013, 6 pages.
U.S. Appl. No. 13/606,894, Non-Final Office Action dated Feb. 5, 2013, 8 pages.
U.S. Appl. No. 13/606,894, Notice of Allowance dated May 24, 2013, 9 pages.
U.S. Appl. No. 13/850,187, Final Office Action dated Nov. 20, 2014, 17 pages.
U.S. Appl. No. 13/850,187, Final Office Action dated Aug. 21, 2015, 21 pages.
U.S. Appl. No. 13/850,187, Non-Final Office Action dated Jun. 16, 2014, 15 pages.
U.S. Appl. No. 13/850,187, Non-Final Office Action dated Mar. 24, 2015, 20 pages.
U.S. Appl. No. 13/850,187, Notice of Allowance dated Jan. 15, 2016, 8 pages.
U.S. Appl. No. 15/153,554, Advisory Action dated Jun. 1, 2017, 6 pages.
U.S. Appl. No. 15/153,554, Final Office Action dated Mar. 22, 2017, 21 pages.
U.S. Appl. No. 15/153,554, First Action Interview Pilot Program Pre-Interview Communication dated Jan. 4, 2017, 4 pages.
U.S. Appl. No. 15/153,554, Notice of Allowance dated Jun. 29, 2017, 7 pages.
Abare et al., Cleaved and Etched Facet Nitride Laser Diodes, IEEE Journal of Selected Topics in Quantum Electronics, vol. 4. No. 3, May-Jun. 1998, pp. 505-509.
Adesida et al., Characteristics of Chemically Assisted Ion Beam Etching of Gallium Nitride, Applied Physics Letters, vol. 65, No. 7, Aug. 15, 1994, pp. 889-891.
Chinese Application No. 200980134723.8, Office Action dated Jun. 27, 2013, 17 pages. ( 10 pages of English translation and 7 pages of original document).
Feezell et al., Development of Nonpolar and Semipolar InGaN/GaN Visible Light-Emitting Diodes, MRS Bulletin, vol. 34, May 2009, pp. 318-323.
Founta et al., Anisotropic Morphology of Nonpolar a-Plane GaN Quantum Dots and Quantum Wells, Journal of Applied Physics, vol. 102, No. 7, 2007, pp. 074304-1-074304-6.
Franssila, Tools for CVD and Epitaxy, Introduction to Microfabrication, 2004, pp. 329-336.
Hashimoto et al., High-Power 2.8 W Blue-Violet Laser Diode for White Light Sources, Optical Review, vol. 19, No. 6, 2012, pp. 412-414.
Kamikawa et al., Highly Reliable 500 mW Laser Diodes with Epitaxially Grown AION Coating for High-Density Optical Storage, Applied Physics Letters, vol. 95, 031106, 2009.
Khan et al., Cleaved Cavity Optically Pumped InGaN—GaN Laser Grown on Spinel Substrates, Applied Physics Letters, vol. 69, No. 16, Oct. 14, 1996, pp. 2418-2420.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, 2004, pp. 7032-7035.
Okamoto et al., Continuous-Wave Operation of m-Plane InGaN Multiple Quantum Well Laser Diodes, The Japan Society of Applied Physics, JJAP Express Letter, vol. 46 No. 9, 2007, pp. L187-L189.
Okamoto et al., High-Efficiency Continuous-Wave Operation of Blue-Green Laser Diodes Based on Nonpolar mPlane Gallium Nitride, The Japan Society of Applied Physics, Applied Physics Express, vol. 1, Jun. 20, 2008, pp. 072201-1-072201-3.
Park , Crystal Orientation Effects on Electronic Properties of Wurtzite InGaN/GaN Quantum Wells, Journal of Applied Physics, vol. 91, No. 12, Jun. 15, 2002, pp. 9904-9908.
International Application No. PCT/US2010/030939, International Search Report and Written Opinion dated Jun. 16, 2010, 9 pages.
International Application No. PCT/US2010/049172, International Search Report and Written Opinion dated Nov. 17, 2010, 7 pages.
International Application No. PCT/US2011/037792, International Preliminary Report on Patentability dated Dec. 6, 2012, 8 pages.
International Application No. PCT/US2011/060030, International Search Report and Written Opinion dated Mar. 21, 2012, 8 pages.
Romanov et al., Strain-Induced Polarization in Wurtzite III-Nitride Semipolar Layers, J. Appl. Phys., vol. 100, 2006, pp. 023522-1-023522-10.
Schoedl et al., Facet Degradation of GaN Heterostructure Laser Diodes, Journal of Applied Physics, vol. 97, No. 12, 2005, pp. 123102-1-123102-8.
Schremer et al., Progress in Etched Facet Technology for GaN and Blue Lasers, Proc. of SPIE 6473, vol. 6473, 2007, pp. 6473F-1-6473F-8.
Tyagi et al., Semipolar (1011) InGaN/GaN Laser Diodes on Bulk GaN Substrates, Japanese Journal of Applied Physics, vol. 46, No. 19, May 11, 2007. pp. L444-L445.

(56) References Cited

OTHER PUBLICATIONS

Zhong et al., Demonstration of High Power Blue-Green Light Emitting Diode on Semipolar (1122) Bulk GaN Substrate, Electronics Letters, vol. 43, No. 15, Jul. 19, 2007, 2 pages.
U.S. Appl. No. 15/937,740 First Action Interview Pilot Program Pre-Interview Communication dated Dec. 26, 2018, 5 pages.
U.S. Appl. No. 15/937,740 First Action Interview Office Action Summary dated Feb. 15, 2019, 6 pages.
Kamikawa, T., et al., "Highly reliable 500 mW laser diodes with epitaxially grown AlON coating for high-density optical storage," Applied Physics Letters, vol. 95, 031106, Jul. 21, 2009, 4 pages.
Schremer, A., et al., "Progress in Etched Facet Technology for GaN and Blue Lasers," Proc. of SPIE, vol. 6473, 2007, 8 pages.
U.S. Appl. No. 15/937,740 Final Office Action dated Jun. 10, 2019, 8 pages.
Ping, A. T. et al., "Study of chemically assisted ion beam etching of GaN using HCl gas," Applied Physics Letter, vol. 67, No. 9, Aug. 28, 1995, pp. 1250-1252.
U.S. Appl. No. 16/786,551 Non-Final Office Action dated Jun. 25, 2020, 14 pages.

\* cited by examiner

FACET ON A GALLIUM AND NITROGEN CONTAINING LASER DIODE

This application is a continuation of U.S. application Ser. No. 15/153,554, filed May 12, 2016, which is a continuation-in-part of U.S. application Ser. No. 13/850,187, filed Mar. 25, 2013, which claims priority under 35. U.S.C. § 119(e) to U.S. Provisional Application No. 61/620,648, filed Apr. 5, 2012, the contents of which are incorporated herein by reference in their entirety.

BACKGROUND

The present disclosure relates generally to optical techniques. More specifically, the present disclosure provides methods and devices using semi-polar oriented gallium and nitrogen containing substrates for optical applications.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of about 1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5% to 10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above, it can be appreciated that techniques for improving optical devices is highly desired.

SUMMARY

The present disclosure generally relates to optical techniques. More specifically, the present disclosure provides methods and devices using semi-polar oriented gallium and nitrogen containing substrates for optical applications.

In one or more examples, the present method and device provides the following:
1. Wurtzite group III-Nitride laser diode composed of layers of various compositions of InGaAlN.
2. Optical device consists of (AlIn)GaN p-type layers and n-type layers cladding a light emitting region comprised of light emitting layers and cladding layers of various compositions of AlInGaN.
3. Device grown either homoepitaxially on a free-standing (AlIn)GaN crystal, hetero-epitaxially on a non (AlIn)GaN substrates with a wurtzite crystal structure (e.g. ZnO), or hetero-epitaxially on a non-wurtzite substrate.
4. Epitaxial surface of device during growth of active region is oriented relative to the InAlGaN crystal such that the epitaxial surface coincides with a nonpolar m-plane or a (40-41), (40-4-1), (30-31), (30-3-1), (20-21), (20-2-1), (30-32), or (30-3-2) crystal plane where Small deviations ("offcut") are acceptable between the above planes and the epitaxial surface.
   a. Acceptable component of offcut toward [0001] is ≤±3.5°;
   b. Offcut can be less than or equal to ≤±10° toward [11-20].
5. LDs operating in the 410-500 nm or in the 500-540 nm range; preferably embodied as lasing between 430 nm and 470 nm or between 505 nm and 535 nm.

In a preferred embodiment, the present method and device includes a gallium and nitrogen containing substrate configured on a surface orientation of (30-3-1), which is offcut from m-plane by about −10 degrees toward (0001), which is desirable for a blue laser diode device operating in the 420 nm to 480 nm range. In one or more embodiments, the following features are included.
1. For active region designs sufficient for laser diode grown on (30-3-1), the EL and PL spectra are much narrower in the blue region compared to a broad m-plane configured device or a device on an orientation which is offcut from m-plane by less than about −8 degrees toward (0001). This indicates that the material is more homogenous and thus will provide a higher material gain than m-plane or even planes miscut by −5, −7, or −8 degrees off of m-plane toward (0001) such as (60-6-1) or (40-4-1).

2. m-plane offers desirable characteristics because it allows the growth of thick p-cladding regions above the active region required in blue laser diodes at relatively high temperatures (e.g., 100 to 200 Degrees Celsius higher than the active region) without substantial degradation to the active region. Additionally, m-plane also enables growth of thick active regions in the blue emission region, which are desirable for high modal gain laser diodes. However, as explained above, the PL and EL emission spectra are broad in the blue regime indicating that material is not homogenous and will not provide maximum gain.

As explained, by mis-cutting off of m-plane toward (000-1) at about 9 or 10 degrees reaching the (30-3-1) or (30-31) planes, it is possible to achieve narrow emission spectra in the blue emission regime of 430 nm to 470 nm or 480 nm. However, if the miscut angle is increased much further than (30-3-1) toward (20-2-1) which is at about 15 degrees off of m-plane, it becomes difficult to grow thick active regions without degradation of the light emission or internal efficiency because defects form at lower strain values. Moreover, on the (20-2-1) plane the growth of the thick p-cladding regions at relatively higher temperature than the active region growth required in laser diodes results in substantial degradation to the light emission properties of the active region material. This characteristic indicates that growth of a highly optimized laser diodes may be difficult.

3. The orientations around (30-3-1) offers an unexpected benefit of enabling bright emission in the blue regime using thick active regions designs and hot p-clad techniques while maintaining a narrow emission spectrum. Although the (30-31) plane offers narrow emission, the (30-3-1) plane offers brighter emission and higher gain. These characteristics are favorable for laser diodes.

This (30-3-1) plane is also highly polarized and very bright. It is desirable to grow the p-clad hot to achieve high crystal quality, low resistance cladding layers. In other embodiments, the present method and device includes (30-3-1) with offcut orientations ranging from plus 1-2 degrees to negative 2-3 degrees toward m-plane.

As used herein in an example, the terms "substantially parallel to the c-projection" should be interpreted by ordinary meaning of one of ordinary skill in the art. As an example, this term indicates that the stripe should be aligned in the c-direction, like within +/−3 to 5 degrees, although there can be variations. In other examples, the stripe can be aligned away (but not opposite) from the projection of the c-direction by 5, 10, 15, 20, or 25 degrees toward the a-direction. In this example, the strips would be "more" aligned to the projection of the c-direction than to the a-direction. Additionally, the plane (30-3-1) refers also to any crystallographically equivalent planes with a minus c-orientation; i.e. (30-3-1), (−303-1), (03-3-1), (0-33-1), (3-30-1) and (−330-1).

Benefits are achieved over pre-existing techniques using the present invention. In particular, the present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present method and devices includes etched facets, thick QW layers, thin barrier layers, AlGaN cladding free for p-clad, n-clad, or both dads, operable in the 395-420 nm range, 420-440 nm range, 440-475 nm range, 475-505 nm range, and 505-535 nm range, but preferably in the 440-475 nm range. As used herein the thick active regions (e.g., summation of all light emitting layers within the device structures, including QW and double hetero-structures) can achieve higher model confinement leading to higher model gain, and an ability to grow laser diode structures that may be free from AlGaN cladding regions or aluminum containing cladding regions, which limits c-plane devices. Depending upon the embodiment, one or more of these benefits may be achieved. These and other benefits may be described throughout the present specification and more particularly below.

In an alternative preferred embodiment, the present method and device includes a gallium and nitrogen containing substrate configured on a surface orientation of (20-21), which is offcut from m-plane by about 14.9 degrees toward (0001), which is desirable for a green laser diode device operating in the 500 nm to 540 nm range. In one or more embodiments, the following features are included. Further details of the (20-21) configuration can be found throughout the present specification and more particularly below.

Certain embodiments of the present disclosure provide a gallium and nitrogen containing laser device configured on either a non-polar or a semipolar surface orientation. The device includes a gallium and nitrogen containing substrate member and a cavity region formed overlying a cladding region and configured in alignment in substantially a c-direction or a projection of the c-direction of the substrate member. The device has a first optical coating formed overlying a first facet and a second optical coating formed overlying a second facet. The first coating overlying the first facet is configured to increase reflectivity and the second coating layer overlying the second facet is configured to reduce reflectivity. The device has an optical power density characterizing the laser device and the laser device is substantially free from catastrophic optical mirror damage (COMD) related failure.

Embodiments provided by the present disclosure achieve these benefits and others in the context of known process technology. However, a further understanding of the nature and advantages of the embodiments disclosed herein may be realized by reference to the specification and the attached drawings.

DETAILED DESCRIPTION

Figure 1:
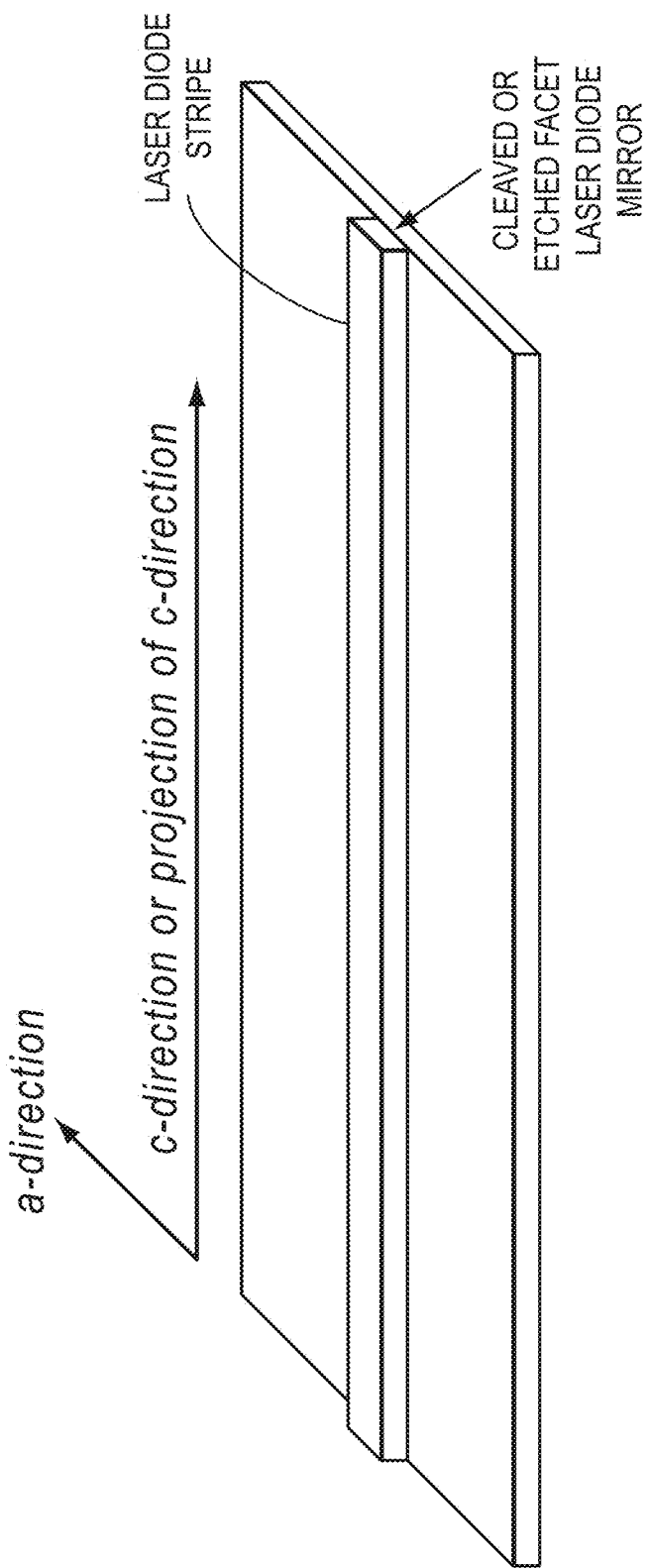
FIG. 1 shows an example of c-direction or projection of a c-direction oriented laser diode stripe on a nonpolar oriented substrate or semipolar oriented substrate in an example.

The present disclosure relates generally to optical techniques. More specifically, the present disclosure provides methods and devices using semi-polar oriented gallium and nitrogen containing substrates for optical applications.

Lasers are useful and important. They are used in many applications and recently visible lasers have reached performance thresholds that make them useful in the field of video displays and video projectors. While there are several technologies that can produce visible lasers, solid-state diode lasers (LDs) emitting at the desired wavelength have the best chance of minimizing system size while maximizing wall-plug efficiency (WPE). While diode lasers emitting with high WPE in the red region of the visible spectrum have been available for years it is only recently that blue and green LDs have become good enough to consider for many high power and space and efficiency conscious applications.

Blue LDs currently available commercially are based on the semiconductor GaN grown with device layers oriented parallel to the (0001) plane of the GaN crystal. Recently, blue LDs based on other crystallographic orientations of GaN have been demonstrated. The so-called "non-polar" orientations [(10-10) or "m-plane" and (11-20) or "a-plane" offer an advantage over c-plane based devices in that the heterostructures that provide for electron and hole confinement do not result in piezoelectric or spontaneous electric fields due to differences in polarization between various AlInGaN alloys used in the devices. In c-plane devices the internal fields result in band-tilting that spatially separates electron and hole bound states and reduces the thickness of InGaN quantum wells that can be used. Smaller quantum wells result in less modal overlap, increased spontaneous emission lifetimes, which respectively reduce the gain and increase the threshold current densities of the devices. Growing in non-polar orientations results in better electron and hole overlap even for wide wells, resulting in higher gain and threshold current densities. Non-polar orientations also have the advantage that photon emission in the plane of the device is not isotropic, such that laser stripes can be oriented parallel to the direction of preferred emission to help decrease threshold currents even further.

While the (0001) and non-polar planes are orthogonal, there is a broad class of low-index planes that are not orthogonal to the (0001). This invention is based on the understanding that blue LD structures grown on a particular subset of semi-polar GaN substrate orientations offer a distinct set of advantages to both (0001) and non-polar oriented devices. Table 1 lists several of the orientations relevant to this invention along with the approximate tilt of these planes away from the (10-10) plane in both the [0001] and [11-20] directions.

m-Plane oriented InGaN/(AlIn)GaN devices exhibit a broadening of luminescence spectra in the range of wavelengths spanning from approximately 415 nm to 470 nm. This is not optimal for providing gain in laser diode active regions since when all other factors are equivalent using a gain medium with a narrower spontaneous emission spectrum will result in higher gain and consequently higher WPE. Growth on semi-polar planes that are derived from the m-plane results in devices with narrower full width at half maximum (FWHM) of luminescence spectra.

Commercially available GaN-based high power laser diodes fabricated on the conventional c-plane orientation typically require special facet coatings to modify the reflectivity of the front mirror/facet where the optical intensity is highest. Such facet coatings are required to reduce the reflectivity of the mirrored surface and thereby increase the slope efficiency and output power of the laser diode. Specialized coating techniques and methods can be used to raise the optical power threshold before the onset of catastrophic optical mirror damage (COMD) that occurs at the front facet where the dielectric coating layers are applied. The origin of the of the COMD failure is typically located at the semiconductor facet-dielectric coating interface and results from absorption induced by mechanisms such as surface states, trace contamination at the interface, surface damage, and/or from other facet imperfections such as roughness or shear lines in a cleaved facet. In conventional c-plane GaN based devices that utilize AlGaN cladding layers or other Al-containing cladding layers, the facet is very susceptible to COMD failure and expensive and/or highly specialized techniques must be used to increase the COMD threshold. As an example, commercial c-plane high power blue laser diodes operating with output powers of above 1W typically require electron cyclotron resonance (ECR) facet coating. This technique requires a large capital expenditure and the equipment requires substantial amount of care and maintenance. An example of this technique is disclosed by Tamikawa et al, Appl. Phys. Lett., 95, 031106 (2009) where AlON interlayers are applied using ECR to increase the optical power level before the onset of COMD. However, to reduce cost and facilitate manufacturing it is desirable to use more conventional deposition techniques such as electron beam (e-beam) deposition, thermal evaporation, sputtering, or plasma enhanced chemical vapor deposition.

We have discovered that by using AlGaN-cladding free high power blue laser designs based on nonpolar/semipolar substrates we can achieve optical density COMD threshold levels using e-beam deposited anti-reflective coatings that are equivalent to the COMD threshold power (optical density) levels achieved in commercial high power blue c-plane laser didoes in which the anti-reflective coatings are deposited using specialized ECR coating process. By inserting an e-beam deposited $SiO_2$ passivation layer between the laser facet and the e-beam deposited $Al_2O_3$ reflectivity modifying layer on nonpolar/semipolar laser diodes with facets that do not suffer from large imperfections resulting from the cleaving process, optical output power density threshold values for COMD are provided that equal those of commercially available AlGaN clad c-plane devices that utilize ECR coatings. Thus, certain embodiments provided by the present disclosure combine nonpolar/semipolar GaN technology with AlGaN cladding free waveguide designs and conventional dielectric deposition techniques to provide low cost, high-throughput methods for forming robust facets useful in high power GaN laser diodes. Additionally, embodiments provided by the present disclosure combine a passivation layer such as $SiO_2$ to increase the optical power density COMD threshold.

Physical imperfections on a laser facet resulting from the cleaving process on non-polar or semi-polar laser diodes can serve as initiation sites for COMD and can greatly reduce the COMD power density threshold and thereby negatively impact high power laser yields. Examples of imperfections in such facets include scaling, bumps, chipping, shear lines, and any feature that deviates from a smooth surface. There can be many causes for these imperfections and although the number of imperfections can be reduced with optimized cleaving, this is challenging on nonpolar and semipolar substrates. The cause of COMD failure at these imperfections can be due to intra-cavity mode filamentation, which results in local spots of very high optical density. Alternatively, the imperfections can exhibit higher optical absorption, which the results in increased local temperature and increased optical absorption. Such absorption can result in a thermal runaway effect and causes COMD failure in conventional laser diodes. Regardless of the failure mechanism, failure occurs at these imperfections. Therefore, it is desirable to eliminate these imperfections on the laser diode facet to suppress COMD failure and increase the power density.

Forming high-quality cleaved facets on nonpolar or on semipolar laser diodes is challenging. On most all nonpolar or semipolar crystal orientations it is desirable to align the laser cavity in the c-direction or in the projection of the c-direction. For a single cavity section device fabricated on the nonpolar m-plane, this requires c-face facet formation since the c-plane is orthogonal to the c-direction. Since the c-plane is not charge neutral, forming high quality cleaved facets can be very challenging. If the surface orientation is rotated off of the c-plane toward semipolar planes or nonpolar planes such as the {30-31}, {30-3-1}, {20-21}, {20-2-1}, {30-32}, {30-32}, or the m-plane, the difficulty in achieving a high quality cleaved facet is great. This is due to the availability of the nonpolar a-face and m-face facets for c-plane surface oriented devices. This is because for a favorable stripe orientation in the projection of the c-direction where the gain is highest on such semipolar and nonpolar planes, the resulting candidate cleaved facet crystal orientations that are orthogonal to the surface plane are the polar c-plane or higher Miller index semipolar planes, which are not natural cleavage planes. Therefore, the challenge of achieving high-quality cleaved facets in such nonpolar or semipolar laser diodes is great and they are likely to suffer from a high number of imperfections such as scaling or shear stress mark that result from the scribing and breaking process. As discussed above, such imperfections can serve as failure sites for COMD at high optical densities. To increase the optical power density threshold for COMD failure it is necessary to have a facet formation technique that minimizes or eliminates such imperfections.

In an example, chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and 93 degrees or between about 89 and 91 degrees from the surface plane of the wafer. The etched facet surface region must be very smooth with root mean square roughness values of less than 50 nm, 20 nm, 5 nm, or 1 nm. Lastly, the etched must be substantially free from damage, which could act as nonradiative recombination centers and hence reduce the COMD threshold. In an example, CAIBE is provides very smooth and low damage sidewalls due to the chemical nature of the etch, while it can provide highly vertical etches due to the ability to tilt the wafer stage to compensate for any inherent angle in etch.

In an example, chemically assisted ion beam etching (CAIBE) characteristics of gallium nitride (GaN) are provided using a SOO-eVAr ion beam directed onto a sample in a Cl, ambient. Enhanced etch rates were obtained for samples etched in the presence of Cl, over those etched only by Ar ion milling at a substrate temperature of 20"C. The CAIBE etch rates were further enhanced at higher substrate temperatures whereas etch rates for Ar ion milling were not influenced by substrate temperature. Etch rates as high as 210 mm/min are reported. The etch rates reported here are the highest so far reported for GaN. Anisotropic etch profiles and smooth etched surfaces in GaN have been achieved with CAIBE. Further details of the CAIBE process can be found in "Characteristics of chemically assisted ion beam etching of gallium nitride," in the names of Adesida, A. T. Ping, C. Youtsey, T. Dow, M. Asif Khan et al., Appl. Phys. Lett. 65, 889 (1994); Published by the American Institute of Physics, which is hereby incorporated by reference herein.

Using the etched facet techniques as described above can yield high quality facets that are free from COMD-causing imperfections. The end yield will be improved compared to the yield obtained using the cleaving process which can lead to imperfections. By combining an etched facet technology to high power nonpolar and/or semipolar laser diodes with substantially Al-free cladding designs and multi-layer facet coating configurations containing a passivation layer and reflectivity modification layer, high power laser diodes with high power density COMD threshold values and high yield can be achieved using conventional facet coating deposition techniques. In addition to CAIBE, other techniques for etching mirrors include inductively coupled plasma (ICP) etching, reactive ion etching (ME) etching, and focused ion beam (FIB) etching. Embodiments provided by the present disclosure combine nonpolar or semipolar laser diode technology with etched facet mirror formation and conventional optical coating layer techniques for reflectivity modification to enable a method for ultra-high COMD thresholds for high power laser diodes.

Certain embodiments provided by the present disclosure include gallium and nitrogen containing laser device configured on either a nonpolar or a semipolar surface orientation, the device comprising: a gallium and nitrogen containing substrate member; a cladding region overlying the substrate member; a cavity region formed overlying the substrate member and configured in alignment in substantially a c-direction or a projection of the c-direction, the cavity region being characterized by a first end and a second end; the first end forming a first facet or mirror; the second end forming a second facet or mirror; a first optical coating formed overlying the first facet, wherein the first coating overlying the first facet is configured to increase a reflectivity; a second optical coating formed overlying the second facet, wherein the second coating layer overlying the second facet is configured to reduce a reflectivity; and an optical power density characterizing the laser device, the laser device being substantially free from COMD related failure.

In certain embodiments of a gallium and nitrogen containing laser device, the nonpolar or semipolar surface orientation comprises an m-plane, a (30-31) plane, a (20-21) plane, a (30-32) plane, a (30-3-1) plane, a (20-2-1) plane, a (30-3-2) plane, or an offcut of within +/−5 degrees of any of these planes toward an a-direction or a c-direction; the cladding region being substantially free from Al-containing material, the cladding region being characterized by an AlN mol fraction in the cladding region of less than about 2%.

In certain embodiments of a gallium and nitrogen containing laser device, the first optical coating is provided by a method selected from electron-beam deposition, thermal evaporation, PECVD, sputtering, and a combination of any of the foregoing.

In certain embodiments of a gallium and nitrogen containing laser device, the first facet and the second facet are formed using a scribing and breaking process.

In certain embodiments of a gallium and nitrogen containing laser device, the first facet and the second facet are formed using an etching process selected from reactive ion etching, inductively coupled plasma etching, and chemical assisted ion beam etching.

In certain embodiments of a gallium and nitrogen containing laser device, the second optical coating comprises $Al_2O_3$.

In certain embodiments of a gallium and nitrogen containing laser device, the second optical comprises at least of $Al_2O_3$ and $SiO_2$.

In certain embodiments of a gallium and nitrogen containing laser device, the second optical coating comprises $Al_2O_3$ and $SiO_2$, and the $SiO_2$ is configured as a passivation layer and is configured between the second facet and the $Al_2O_3$.

In certain embodiments of a gallium and nitrogen containing laser device, the device comprises an output cavity width of greater than about 3 μm and less than about 20 μm, and is operable at over 1W.

In certain embodiments of a gallium and nitrogen containing laser device, the device comprises an output cavity width of greater than about 3 μm and less than about 25 μm, and is operable at over 2W.

In certain embodiments of a gallium and nitrogen containing laser device, the device comprises an output cavity width of greater than about 3 μm and less than about 35 μm, and is operable at over 3W.

In certain embodiments of a gallium and nitrogen containing laser device, the device comprises an output cavity width of greater than about 3 μm and less than about 35 μm and is operable at over 4.5 W In certain embodiments of a gallium and nitrogen containing laser device, the device comprises an output cavity width of greater than about 3 μm and less than about 50 μm, and is operable at over 3 W.

In certain embodiments of a gallium and nitrogen containing laser device, the device is operable at a wavelength from 430 nm to 480 nm.

In certain embodiments of a gallium and nitrogen containing laser device, the device is operable at a wavelength from 480 nm to 535 nm.

In certain embodiments of a gallium and nitrogen containing laser device, the device is operable at a wavelength from 390 nm to 430 nm.

FIG. 1 shows an example of c-direction or projection of a c-direction oriented laser diode stripe on a nonpolar or semipolar oriented substrate. One of ordinary skill in the art would recognize other variations, modifications, and alternatives. As shown in an example, the optical device includes a gallium nitride substrate member having a semipolar crystalline surface region characterized by an orientation of about 9 degrees to about 12.5 degrees toward (000-1) from the m-plane. In a specific embodiment, the gallium nitride substrate member is a bulk GaN substrate characterized by having a semipolar crystalline surface region, but can be others. In a specific embodiment, the bulk GaN substrate has a surface dislocation density below $10^5$ $cm^{-2}$ or $10^5$ to $10^7$ $cm^{-2}$. It should be noted that homoepitaxial growth on bulk GaN is generally better than hetero-epitaxy growth. The nitride crystal or wafer may comprise $Al_xIn_yGa_{1-x-y}N$, where $0 \le x, y, x+y \le 1$. In one specific embodiment, the nitride crystal comprises GaN. In one or more embodiments, the GaN substrate has threading dislocations, at a concentration between about $10^5$ $cm_{-2}$ and about $10^8$ $cm^{-2}$, in a direction that is substantially orthogonal or oblique with respect to the surface. As a consequence of the orthogonal or oblique orientation of the dislocations, the surface dislocation density is below about $10^5$ $cm^{-2}$ or others such as those ranging from about $10^5$-$10^8$ $cm^{-2}$. Of course, there can be other variations, modifications, and alternatives.

In a specific embodiment, the device has a laser stripe region formed overlying a portion of the semipolar crystalline orientation surface region. In a specific embodiment, the laser stripe region is characterized by a cavity orientation is substantially parallel to the projection of the c-direction. In a specific embodiment, the laser stripe region has a first end and a second end. In a preferred embodiment, the device has a first facet provided on the first end of the laser stripe region and a second facet provided on the second end of the laser stripe region. In one or more embodiments, the first facet is substantially parallel with the second facet. Mirror surfaces are formed on each of the surfaces. The first facet comprises a first mirror surface. In a preferred embodiment, the first mirror surface is provided by an etching process. The etching process can use any suitable techniques, such as a chemical etching process using a CAIBE etching processor combinations. In a specific embodiment, the first mirror surface comprises a reflective coating. In a specific embodiment, deposition of the reflective coating occurs using, for example, e-beam evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Additionally, the facets can be etched or a combination of them. Of course, there can be other variations, modifications, and alternatives. Also in a preferred embodiment, the second facet comprises a second mirror surface. The second mirror surface is provided by an etching techniques using etching technologies such as reactive ion etching (ME), inductively coupled plasma etching (ICP), or chemical assisted ion beam etching (CAIBE), or other method. In an example, (CAIBE), (ICP), or (ME) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO$_2$), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and 93 degrees or between about 89 and 91 degrees from the surface plane of the wafer. The etched facet surface region must be very smooth with root mean square roughness values of less than 50 nm, 20 nm, 5 nm, or 1 nm. Lastly, the etched should be substantially free from damage, which could act as non-radiative recombination centers and hence reduce the COMD threshold. In an example, CAIBE is provides very smooth and low damage sidewalls due to the chemical nature of the etch, while it can provide highly vertical etches due to the ability to tilt the wafer stage to compensate for any angle in etch in an example.

In a specific embodiment, the second mirror surface comprises a reflective coating, such as silicon dioxide, hafnia, titania, tantalum pentoxide, zirconia, combinations, and the like. In a specific embodiment, the second mirror surface comprises an anti-reflective coating, such alumina or aluminum oxide. In a specific embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed surface prior to coating. Of course, there can be other variations, modifications, and alternatives. In a specific embodiment, the laser stripe has a length and width. The length ranges from about 200 microns to about 3000 microns. The stripe also has a width ranging from about 0.5 microns to about 50 microns, but can be other dimensions. In a specific embodiment, the stripe can also be about 6 to 25 microns wide for a high power multi-lateral-mode device or 1 to 2 microns for a single lateral mode laser device. In a specific embodiment, the width is substantially constant in dimension, although there may be slight variations. The width and length are often formed using a masking and etching process, which are commonly used in the art. Further details of the present device can be found throughout the present specification and more particularly below.

In a specific embodiment, the device is also characterized by a spontaneously emitted light that is polarized in substantially perpendicular to the projection of the c-direction (in the a-direction. That is, the device performs as a laser or the like. In a preferred embodiment, the spontaneously emitted light is characterized by a polarization ratio of greater than 0.2 to about 1 perpendicular to the c-direction. In a preferred embodiment, the spontaneously emitted light characterized by a wavelength ranging from about 400 nanometers to yield a violet emission, a blue emission, a green emission, and others. In one or more embodiments, the light can be emissions ranging from violet 395 to 420 nanometers; blue 430 to 470 nm; green 500 to 540 nm; and others, which may slightly vary depending upon the application. In a preferred embodiment, the spontaneously emitted light is highly polarized and is characterized by a polarization ratio of greater than 0.4. In a specific embodiment, the emitted light is characterized by a polarization ratio that is desirable. Of course, there can be other variations, modifications, and alternatives. Further details of the laser device can be found throughout the present specification and more particularly below.

Figure 2:
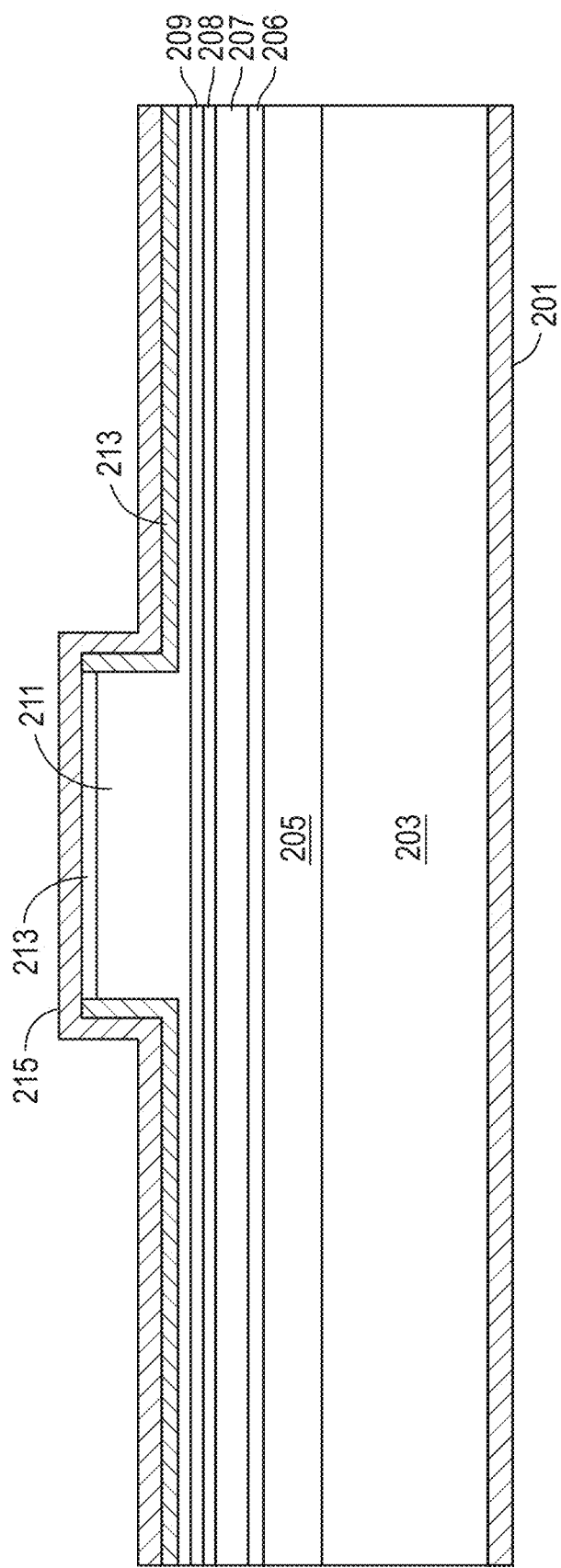
FIG. 2 shows a cross-sectional view of a waveguide design of a nonpolar or a semipolar laser diode that contains cladding regions that are substantially free from aluminum containing species in an example.

FIG. 2 shows a cross-sectional view of a waveguide design of a nonpolar or a semipolar laser diode that contains cladding regions that are substantially free from aluminum. Such laser diode designs can enable high COMD levels without the need for highly-specialized and costly mirror coating techniques such as electron cyclotron resonance (ECR). As shown in an example, the laser device includes gallium nitride substrate, which has an underlying n-type metal back contact region. In a specific embodiment, the metal back contact region is made of a suitable material such as those noted below and others. Further details of the contact region can be found throughout the present specification and more particularly below. FIG. 2 shows substrate 203, which has an underlying n-type metal back contact region 201, n-type gallium nitride layer 205 overlying substrate 205, n-side separate confinement heterostructure (SCH) 206, active region 207, p-side guiding layer or separate confinement heterostructure 208, p-type electron blocking layer 209, p++ type gallium nitride contact region 213, metal contact layer 215, and p-type gallium containing nitride layer configured as a laser stripe 211.

In a specific embodiment, the device also has an overlying n-type gallium nitride layer, an active region, and an overlying p-type gallium nitride layer structured as a laser stripe region. Additionally, the device also includes an n-side separate confinement hetereostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about 10E19 to 10E21 Mg/centimeter$^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm is initiated.

In a specific embodiment, the laser stripe region is made of the p-type gallium nitride layer 211. In a specific embodiment, the laser stripe is provided by an etching process selected from dry etching or wet etching. In a preferred embodiment, the etching process is dry, but can be others. As an example, the dry etching process is an inductively coupled plasma process using chlorine bearing species or a reactive ion etching process using similar chemistries or combination of ICP and RIE, among other techniques. Again as an example, the chlorine bearing species are commonly derived from chlorine gas or the like. The device also has an overlying dielectric region, which exposes 213 contact region, which is preferably a p++gallium nitride region. In a specific embodiment, the dielectric region is an oxide such as silicon dioxide or silicon nitride, but can be others, such as those described in more detail throughout the present specification and more particularly below. The contact region is coupled to an overlying metal layer 215. The overlying metal layer is a multilayered structure containing gold and platinum (Ni/Au), but can be others such as gold and palladium (Pd/Au) or gold and nickel (Ni/Au). In an alternative embodiment, the metal layer comprises Ni/Au formed using suitable techniques. In a specific embodiment, the Ni/Au is formed via electron-beam deposition, sputtering, or any like techniques. The thickness includes nickel material ranging in thickness from about 50 to about 100 nm and gold material ranging in thickness from about 100 Angstroms to about 1-3 microns, and others. Of course, there can be other variations, modifications, and alternatives In a preferred embodiment, the dielectric region can be made using a suitable technique. As an example, the technique may include reactively sputter of $SiO_2$ using an undoped polysilicon target (99.999% purity) with $O_2$ and Ar. In a specific embodiment, the technique uses RF magnetron sputter cathodes configured for static deposition; sputter target; throw distance; pressure: 1-5 mT or about 2.5 mT, power: 300 to 400 W; flows: 2-3.-9 sccm 02, 20-50 sccm, Ar, deposition thickness: 1000-2500 A, and may include other variations. In a specific embodiment, deposition may occur using non-absorbing, nonconductive films, e.g., $Al_2O_3$, $Ta_2O_5$, $SiO_2$, $Ta_2O_5$, $ZrO_2$, $TiO_2$, $HfO_2$, $NbO_2$. Depending upon the embodiment, the dielectric region may be thinner, thicker, or the like. In other embodiments, the dielectric region can also include multilayer coatings, e.g., 1000 A of $SiO_2$ capped with 500 A of $Al_2O_3$. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. Preferably, the active layer may include about 3-7 quantum wells or more preferably 4-6 quantum wells or others. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 30 nm. In a preferred embodiment, each of the thicknesses is preferably 3-8 nm. In a specific embodiment, each well region may have a thickness of about 5 nm to 7 nm and each barrier region may have a thickness of about 2 nm to about 5 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In a specific embodiment, the separate confinement heterostructure (SCH) can include AlInGaN or preferably InGaN, but can be other materials. The SCH is generally comprised of material with an intermediate index between the cladding layers and the active layers to improve confinement of the optical mode within the active region of the laser device according to a specific embodiment. In one or more embodiments, the SCH layers have a desirable thickness, impurity, and configuration above and below the active region to confine the optical mode. Depending upon the embodiment, the upper and lower SCH can be configured differently or the same. The electron blocking region can be on either side or both sides of the SCH positioned above the active region according to a specific embodiment. In a preferred embodiment, the SCH can range from about 100 nm to about 1500 nm, and preferably about 40 to 100 nm for the lower SCH region. In the upper SCH region, the thickness ranges from about 20 to 50 nm in a specific embodiment. As noted, the SCH is preferably InGaN having about 2% to about 5% indium or 5% to about 10% by atomic percent according to a specific embodiment. Of course, there can be other variations, modifications, and alternatives.

In some embodiments, an electron blocking layer is preferably deposited. In a specific embodiment, the electron blocking layer comprises a gallium and nitrogen containing material including magnesium 10E16 $cm^{-3}$ to about 10E22 $cm^{-3}$. The electron-blocking layer may comprise $Al_s In_t Ga_{1-s-t}N$, where 0≤s, t, s+t≤1, with a higher bandgap than the active layer, and may be doped p-type. In one specific embodiment, the electron blocking layer comprises AlGaN with an Al composition ranging from 5 to 20%. In another embodiment, the electron blocking layer may not contain Al. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure, which can be a p-type doped $Al_q In_r Ga_{1-q-r}N$, where 0≤q, r, q+r≤1, layer is deposited above the active layer. The p-type layer may be doped with Mg, to a level between about $10^{16}$ $cm^{-3}$ and $10^{22}$ $cm^{-3}$, and may have a thickness between about 5 nm and about 1000 nm. The outermost 1 nm to 50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others. Of course, there can be other variations, modifications, and alternatives.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives.

In a specific embodiment, a ridge waveguide is fabricated using a certain deposition, masking, and etching processes. In a specific embodiment, the mask is comprised of photoresist (PR) or dielectric or any combination of both and/or different types of them. The ridge mask is 1 to 2.5 microns wide for single lateral mode applications or 2.5 µm to 30 µm wide for multimode applications. The ridge waveguide is etched by ion-coupled plasma (ICP), reactive ion etching (ME), chemical assisted ion beam (CAIBE) etched, or other method. The etched surface is 20-250 nm above the active region. A dielectric passivation layer is then blanket deposited by any number of commonly used methods in the art, such as sputter, e-beam, PECVD, or other methods. This passivation layer can include $SiO_2$, $Si_3N_4$, $Ta_2O_5$, or others. The thickness of this layer is 80 nm to 400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au. Further details of the present method and resulting structure can be found throughout the present specification and more particularly below. Further details of the facets can be found throughout the present specification and more particularly below.

In one or more preferred embodiments, the present invention provides a laser structure without an aluminum bearing cladding region. In a specific embodiment, the laser device comprises a multi-quantum well active region having thin barrier layers. In one or more embodiments, the active region comprises three or more quantum well structures. Between each of the quantum well structures comprises a thin barrier layer, e.g., 7 nm and less, 6 nm and less, 5 nm and less, 4 nm and less, 3 nm and less, 2 nm and less. In a preferred embodiment, the combination of thin barrier layers configured in the multi-quantum well structures enables a low voltage (e.g., 6 volts and less) laser diode free from use of aluminum bearing cladding regions.

In a specific embodiment, the present invention provides an optical device. The optical device has a gallium and nitrogen containing substrate including a (30-3-1) or offcut crystalline surface region orientation, which may be off-cut. The device preferably has an n-type cladding material overlying the n-type gallium and nitrogen containing material according to a specific embodiment. The n-type cladding material is substantially free from an aluminum bearing material according to a specific embodiment. The device also has an active region comprising at least three quantum wells. Each of the quantum wells has a thickness of 3.0 nm and greater or 5.5 nm and greater, and one or more barrier layers. Each of the barrier layers has a thickness ranging from about 2 nm to about 5 nm or about 5 nm to about 9 nm and is configured between a pair of quantum wells according to a specific embodiment. At least one or each of the barrier layers has a thickness ranging from about 2 nm to about nm and is configured between a pair of quantum wells or adjacent to a quantum well according to a specific embodiment. At least one or each of the barrier layers has a thickness ranging from about 4 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 6V or less than about 5V for the device for an output power of 60 mW or 100 mW and greater. Of course, there can be other variations, modifications, and alternatives.

In yet an alternative embodiment, the present invention provides an optical device. The device has a gallium and nitrogen containing substrate including a (30-3-1) or offcut crystalline surface region orientation. The device also has an n-type cladding material overlying the n-type gallium and nitrogen containing material. The n-type cladding material is substantially free from an aluminum bearing material. The device further has an active region comprising at least three quantum wells. Each of the quantum wells has a thickness of 3.5 nm and greater or 5 nm and greater and one or more barrier layers according to a specific embodiment. Each of the barrier layers has a thickness ranging from about 2 nm to about 4 nm or about 4 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 4 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a (30-3-1) or offcut crystalline surface region orientation. An n-type cladding material is overlying the n-type gallium and nitrogen containing material. Preferably, the n-type cladding material is substantially free from an aluminum bearing material. The device has an active region comprising at least three quantum wells, each of which has a thickness of 4 nm and greater. The device has one or more barrier layers, each of which has an n-type impurity characteristic and a thickness ranging from about 2 nm to about 4 nm or about 4 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a (30-3-1) or offcut crystalline surface region orientation. An n-type cladding material is overlying the n-type gallium and nitrogen containing material. Preferably, the n-type cladding material is substantially free from an aluminum bearing material. The method includes forming an active region comprising at least three quantum wells, each of which has a thickness of 3.5 nm and greater. The device has one or more barrier layers, each of which has an n-type impurity characteristic and a thickness ranging from about 2 nm to about 4 nm or about 4 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a (30-3-1) or offcut crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least three quantum wells. In a specific embodiment, each of the quantum wells has a thickness of 3.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6V or less than about 7V for the device for an output power of 60 mW and greater. In other embodiments for nonpolar m-plane devices or semipolar (30-3-1) planes, operable in the blue (430-475 nm) and green (505-530 nm), the present method and structure include five (5) or more thick QWs of greater than 4 or 5 nm in thickness and thin barriers that are 2-4 nm in thickness.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 3-4 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present invention provides a laser device and method that is free from aluminum-containing cladding regions with low voltage on (30-3-1) or offcut substrates. Of course, there can be other variations, modifications, and alternatives.

Moreover, the present invention provides an optical device that is substantially free from aluminum bearing cladding materials. The device has a gallium and nitrogen containing substrate member having a (30-3-1) or offcut crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser stripe region has a first end and a second end. The device also has a first etched or etched facet provided on the first end of the laser stripe region and a second etched or etched facet provided on the second end of the laser stripe region. Depending upon the embodiment, the facets may be etched, etched, or a combination of cleaved and etched. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like. Further details of these limitations can be found throughout the present specification and more particularly below.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further benefits are described throughout the present specification and more particularly below.

In alternative example, the present invention provides a green laser diode configured using a semipolar gallium and nitrogen containing bulk substrate member, as described in more detail below, which has etched facets.

In preferred embodiments, the invention provides a laser structure without an aluminum bearing cladding region. In a specific embodiment, the laser device comprises a multi-quantum well active region having thin barrier layers, with the active region comprising three or more quantum well structures. Between each of the quantum well structures is a thin barrier layer, e.g., 8 nm and less, 7 nm and less, 6 nm and less, 5 nm and less, 4 nm and less, 3 nm and less, 2 nm and less, 1.5 nm and less. In a preferred embodiment, the combination of thin barrier layers configured in the multi-quantum well structures enables a low voltage (e.g., 7 volts and less, 6 volts and less) laser diode free from use of aluminum bearing cladding regions.

In one embodiment, the optical device has a gallium and nitrogen containing substrate including a {20-21} crystalline surface region orientation, which may be off-cut. The device preferably has an n-type cladding material overlying the n-type gallium and nitrogen containing material according to a specific embodiment. The n-type cladding material is substantially free from an aluminum bearing material. The device also has an active region comprising at least three quantum wells. Each of the quantum wells has a thickness of 2.5 nm and greater or 3.5 nm and greater and one or more barrier layers. Each of the barrier layers has a thickness ranging from about 2 nm to about 4 nm or about 3 nm to about 6.5 nm and is configured between a pair of quantum wells according to a specific embodiment. At least one or each of the barrier layers has a thickness ranging from about 2 nm to about 4 nm and is configured between a pair of quantum wells or adjacent to a quantum well according to a specific embodiment. At least one or each of the barrier layers has a thickness ranging from about 3 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 7V or less than about 6V for the device for an output power of 60 mW and greater.

In yet an alternative embodiment, the present invention provides an optical device. The device has a gallium and nitrogen containing substrate including a {20-21} crystalline surface region orientation. The device also has an n-type cladding material overlying the n-type gallium and nitrogen containing material. The n-type cladding material is substantially free from an aluminum bearing material. The device further has an active region comprising at least two quantum wells. Each of the quantum wells has a thickness of 2.5 nm and greater or 3.5 nm and greater and one or more barrier layers according to a specific embodiment. Each of the barrier layers has a thickness ranging from about 2 nm to about 5 nm or about 3 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 3 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The device has an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The method includes forming an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a {20-21} crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least two quantum wells. In a specific embodiment, each of the quantum wells has a thickness of 2.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6v or less than about 7V for the device for an output power of 60 mW and greater.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 5 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present invention provides a laser device and method that is free from aluminum-containing cladding regions with low voltage on {20-21) substrates.

Moreover, the present invention provides an optical device that is substantially free from aluminum bearing cladding materials. The device has a gallium and nitrogen containing substrate member having a {20-21} crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser stripe region has a first end and a second end. The device also has a first etched facet provided on the first end of the laser stripe region and a second etched facet provided on the second end of the laser stripe region. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures.

In a specific embodiment on the {20-21} GaN, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser stripe region has a first end and a second end, each of which is etched. In a preferred embodiment, the device is formed on a projection of a c-direction on a {20-21} gallium and nitrogen containing substrate having a pair of etched mirror structures, which face each other.

In a preferred embodiment, the device has a first etched facet provided on the first end of the laser stripe region and a second etched facet provided on the second end of the laser stripe region. In one or more embodiments, the first etched is substantially parallel with the second etched facet. Mirror surfaces are formed on each of the etched surfaces. The first etched facet comprises a first mirror surface. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second etched facet comprises a second mirror surface. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

In a specific embodiment, the laser stripe has a length and width. The length ranges from about 50 microns to about 3000 microns or preferably from about 400 microns to about 650 microns or about 650 microns to about 1200 um microns. The strip also has a width ranging from about 0.5 microns to about 50 microns or preferably between 1 microns to about 1.5 microns, about 1.5 microns to about 2.0 microns, or about 2.0 microns to about 4 microns, but can be other dimensions. In a specific embodiment, the width is substantially constant in dimension, although there may be slight variations. The width and length are often formed using a masking and etching process, which are commonly used in the art.

In a specific embodiment, the present invention provides an alternative device structure capable of emitting 501 nm and greater light in a ridge laser embodiment having etched facets. The device is provided with one or more of the following epitaxially grown elements, but is not limiting.

an n-GaN cladding layer with a thickness from 100 nm to 3000 nm with Si doping level of 5E17 to 3E18 $cm^{-3}$;

an n-side SCH layer comprised of InGaN with molar fraction of indium of between 3% and 10% and thickness from 20 to 150 nm;

multiple quantum well active region layers comprised of at least two 2.0-5.5 nm InGaN quantum wells separated by thin 2.5 nm and greater, and optionally up to about 8 nm, GaN barriers;

a p-side SCH layer comprised of InGaN with molar a fraction of indium of between 1% and 10% and a thickness from 15 nm to 100 nm;

an electron blocking layer comprised of AlGaN with molar fraction of aluminum of between 5% and 20% and thickness from 5 nm to 20 nm and doped with Mg;

a p-GaN cladding layer with a thickness from 400 nm to 1000 nm with Mg doping level of 2E17 cm–3 to 2E19 $cm^{-3}$; and a $p^{++}$-GaN contact layer with a thickness from 20 nm to 40 nm with Mg doping level of 1E19 cm–3 to 1E21 $cm^{-3}$.

Of course there can be other embodiments such as the use of p-side GaN guiding layer in place of the p-SCH, the use of multiple different layers in the SCH regions, or the omission of the EBL layer. Again, there can be other variations, modifications, and alternatives.

In an example, a laser device is fabricated on a {20-21} substrate according to an embodiment of the present invention. The laser device includes gallium nitride substrate, which has an underlying n-type metal back contact region. In a specific embodiment, the metal back contact region is made of a suitable material such as those noted below and others. Further details of the contact region can be found throughout the present specification, and more particularly below.

In a specific embodiment, the device also has an overlying n-type gallium nitride layer, an active region, and an overlying p-type gallium nitride layer structured as a laser stripe region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and $10^{20}$ $cm^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ $cm^{-3}$ and $10^{20}$ $cm^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia.

A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes contact region. In a specific embodiment, the dielectric region is an oxide such as silicon dioxide or silicon nitride, but can be others. The contact region is coupled to an overlying metal layer. The overlying metal layer is a multilayered structure containing gold and platinum (Pt/Au), nickel gold (Ni/Au), but can be others.

In a specific embodiment, the laser device has active region. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other embodiments, the well layers and barrier layers comprise $Al_wIn_xGa_{1-w-x}N$ and $Al_yIn_zGa_{1-y-z}N$, respectively, where $0\leq_w$, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN superlattice structure, comprising alternating layers of AlGaN and GaN, each with a thickness between about 0.2 nm and about 5 nm.

In a specific embodiment, the action region structure does not include an AlGaN EBL layer. That is, the laser device is free from any electron blocking layer, which is optional in such embodiment.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes a contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In an example, a laser device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, and 510 nm to 530 nm, but can be others.

In a preferred embodiment, the growth structure is configured using between 3 and 5 or 5 and 7 quantum wells positioned between n-type GaN and p-type GaN cladding layers. In a specific embodiment, the n-type GaN cladding layer ranges in thickness from 500 nm to 2000 nm and has an n-type dopant such as Si with a doping level of between 1E18 cm−3 and 3E18 cm$^{-3}$. In a specific embodiment, the p-type GaN cladding layer ranges in thickness from 500 nm to 1000 nm and has a p-type dopant such as Mg with a doping level of between 1E17 cm$^{-3}$ and 7E19 cm$^{-3}$. In a specific embodiment, the Mg doping level is graded such that the concentration would be lower in the region closer to the quantum wells.

In a specific preferred embodiment, the quantum wells have a thickness of between 2.5 nm and 4 nm, 4 nm and 5.5 nm or 5.5 nm and 8 nm, but can be others. In a specific embodiment, the quantum wells would be separated by barrier layers with thicknesses between 2 nm and 3.5 nm or 3.5 nm and 6 nm or 6 nm and 8 nm. The quantum wells and the barriers together comprise a multiple quantum well (MQW) region.

In a preferred embodiment, the device has barrier layers formed from GaN, InGaN, AlGaN, or InAlGaN. In a specific embodiment using InGaN barriers, the indium contents range from 0% to 5% (mole percent), but can be others. Also, it should be noted that % of indium or aluminum is in a molar fraction, not weight percent.

An InGaN separate confinement hetereostructure layer (SCH) could be positioned between the n-type GaN cladding and the MQW region according to one or more embodiments. Typically, such separate confinement layer is commonly called the n-side SCH. The n-side SCH layer ranges in thickness from 10 nm to 60 nm or 60 nm to 150 nm and ranges in indium composition from 1% to 12% (mole percent), but can be others. In a specific embodiment, the n-side SCH layer may be doped with an n-type dopant such as Si.

In yet another preferred embodiment, an InGaN separate confinement heterostructure layer (SCH) is positioned between the p-type GaN cladding and the MQW region, which is called the p-side SCH. In a specific embodiment, the p-side SCH layer ranges in thickness from 10 nm to 40 nm or 40 nm to 150 nm and ranges in indium composition from 0% to 10% (mole percent), but can be others. The p-side SCH layer may be doped with a p-type dopant such as Mg.

In another embodiment, the structure would contain both an n-side SCH and a p-side SCH. In another embodiment the p-side SCH would be replaced with p-side GaN guiding layer. In another embodiment the n-side and/or p-side SCH regions would contain multiple layers.

In another embodiment, the structure would contain a GaN guiding layer on the p-side positioned between the p-type GaN cladding layer and the MQW region. This GaN guiding layer could range in thickness from 10 nm to 60 nm and may or may not be doped with a p-type species such as Mg.

In a specific preferred embodiment, an AlGaN electron blocking layer, with an aluminum content of between 5% and 20% (mole percent), is positioned between the MQW and the p-type GaN cladding layer either between the MQW and the p-side SCH, within the p-side SCH, or between the p-side SCH and the p-type GaN cladding. The AlGaN electron blocking layer ranges in thickness from 5 nm to 20 nm and is doped with a p-type dopant such as Mg from 1E17 $cm^{-3}$ and 1E21 $cm^{-3}$ according to a specific embodiment. In other embodiments, the electron blocking layer is free from any aluminum species and/or may be eliminated all together. In yet another embodiment, the device would be substantially free from an electron blocking layer.

Preferably, a p-contact layer positioned on top of and is formed overlying the p-type cladding layer. The p-contact layer would be comprised of GaN doped with a p-dopant such as Mg at a level ranging from 1E20 cm-3 to 1E22 cm-3.

In an example, a laser device has a gallium and nitrogen containing substrate member (e.g., bulk gallium nitride) having a {20-21} crystalline surface region or other surface configuration. The device has an n-type gallium and nitrogen containing cladding material. In a specific embodiment, the n-type gallium and nitrogen containing cladding material is substantially free from an aluminum species, which leads to imperfections, impurities, and other limitations. In one or more preferred embodiment, the cladding material has no aluminum species and is made of a gallium and nitrogen containing material. Of course, there can be other variations, modification, and alternatives.

In a specific embodiment, the device also has an active region including multiple quantum well structures overlying the n-type gallium and nitrogen containing cladding material. In one or more embodiments, the active regions can include those noted, as well as others. That is, the device can include InGaN/InGaN and/or InGaN/GaN active regions, among others. In a specific embodiment, the optical can include seven MQW, six MQW, five MQW, four MQW, three MQW, more MQW, or fewer, and the like. Of course, there can be other variations, modification, and alternatives.

In a specific embodiment, the device has a p-type gallium and nitrogen containing cladding material overlying the active region. In a preferred embodiment, the p-type gallium and nitrogen containing cladding material is substantially free from an aluminum species, which leads to imperfections, defects, and other limitations. In one or more preferred embodiment, the cladding material has no aluminum species and is made of a gallium and nitrogen containing material.

In a specific embodiment, the device preferably includes a laser stripe region configured from at least the active region and characterized by a cavity orientation substantially parallel to a projection in a c-direction. Other configurations may also exist depending upon the specific embodiment. The laser stripe region has a first end and a second end or other configurations. In a specific embodiment, the device also has a first etched facet provided on the first end of the laser stripe region and a second etched facet provided on the second end of the laser stripe region.

In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further details of the present laser configured on {20-21} can be found in U.S. application Ser. No. 12/883, 652 filed on Sep. 16, 2010, which is incorporated by reference herein.

Figure 3A:
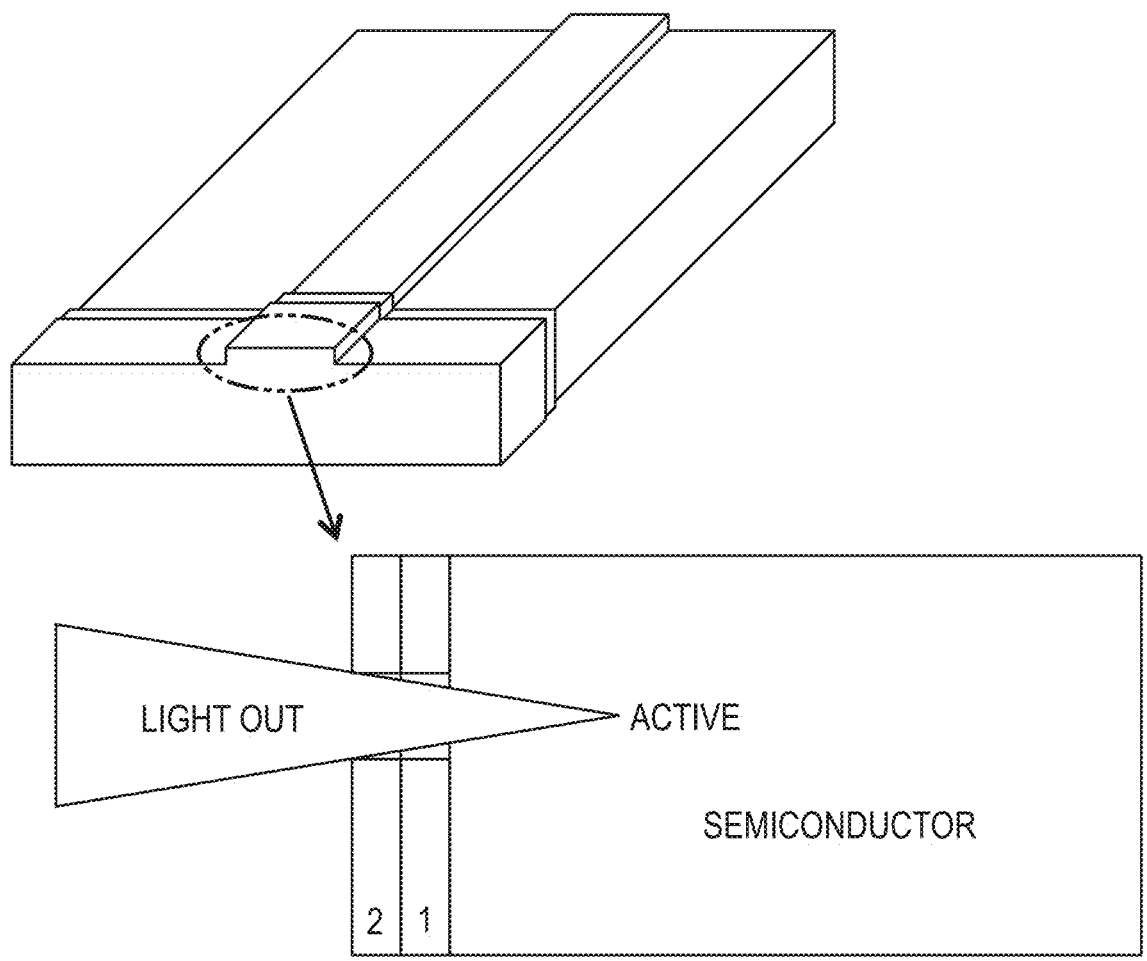
FIG. 3A shows a schematic diagram of a typical configuration of a laser facet with optical coating in an example.

FIG. 3A shows a schematic diagram of a typical configuration of a laser facet with optical coating configured in two dielectric layers where layer 1 functions as the passivation layer to increase the COMD level and layer 2 functions as the reflectivity modification layer.

Figure 3B:
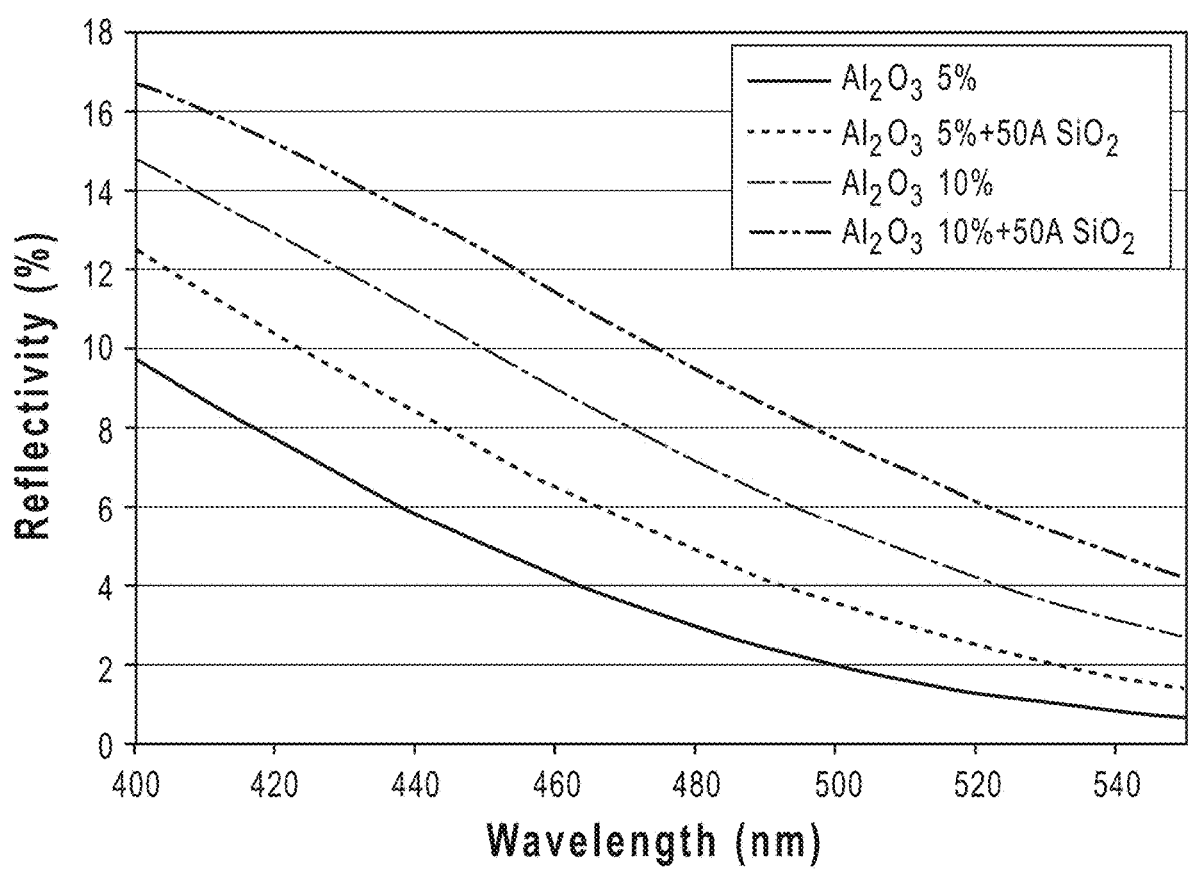
FIG. 3B shows a graph of the reflectivity (%) of a laser diode front facet versus the wavelength (nm) for an optical coating configurations with and without the passivation layer shown in FIG. 3A in an example.

FIG. 3B shows a graphs of the reflectivity (%) of a laser diode front facet versus the wavelength (nm) for optical coating configurations with and without the passivation layer shown in FIG. 3A, and for designs targeting ~5% and ~10% reflectivity in the blue region. The curves show that a thin $SiO_2$ passivation layer offsets the reflectivity at a given wavelength.

Figure 4A:
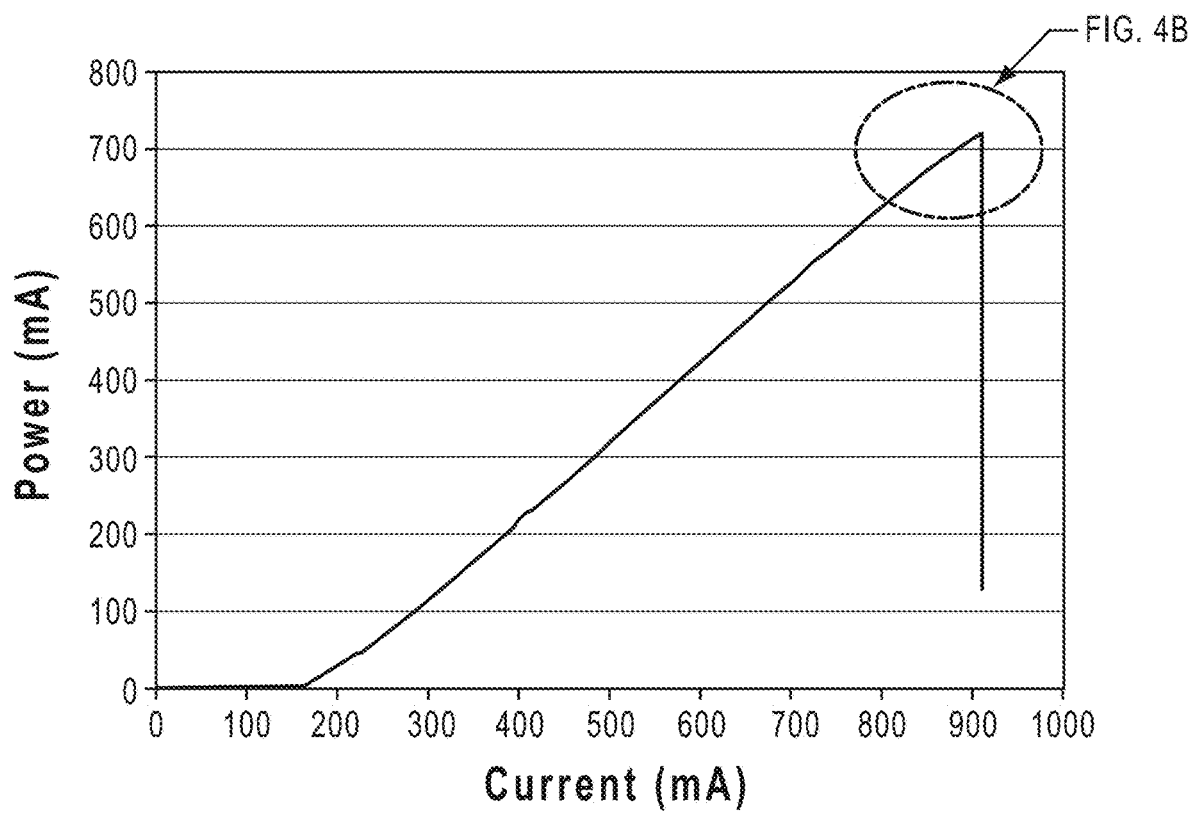
FIG. 4A shows a graph of laser output power (mA) versus input current (mA) for a laser diode that undergoes a COMD failure at >700 mW output power in an example.
Figure 4B:
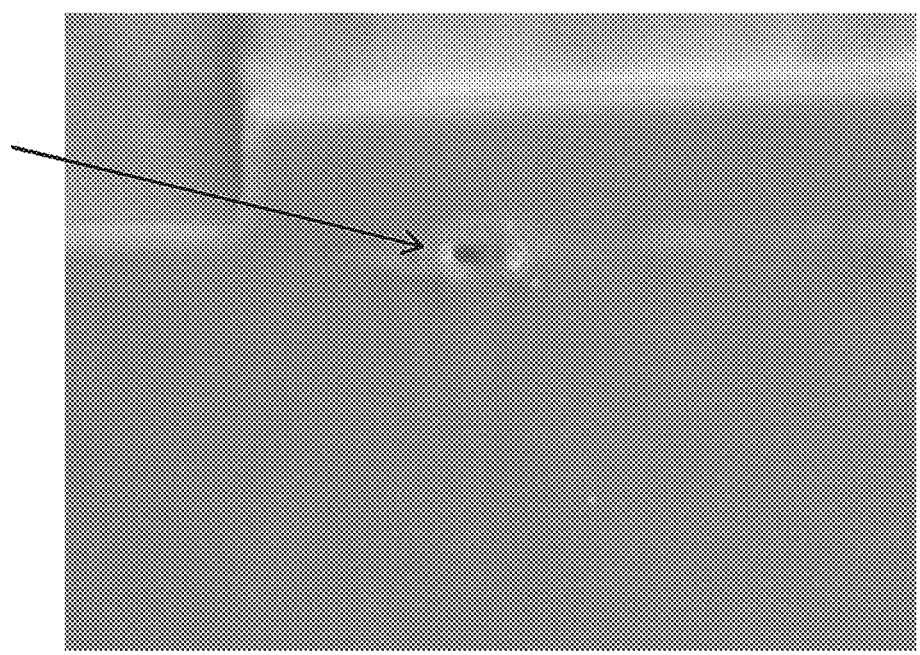
FIG. 4B shows an image of the irreversible damage at the front facet of the laser that occurs with COMD. It can be seen that COMD results in a sudden drop in power. COMD is typically a thermal runaway process, consistent with the apparent burn mark/hole on the laser facet.

FIG. 4A shows a graph of laser output power (mA) versus input current (mA) for a laser diode that undergoes a COMD failure at >700 mW output power. Upon the onset of COMD the output power abruptly drops. FIG. 4B shows an image of the irreversible damage at the front facet of the laser that occurs with COMD. It can be seen that COMD results in a sudden drop in power. COMD is typically a thermal runaway process, consistent with the apparent burn mark/hole on the laser facet.

Figure 5:
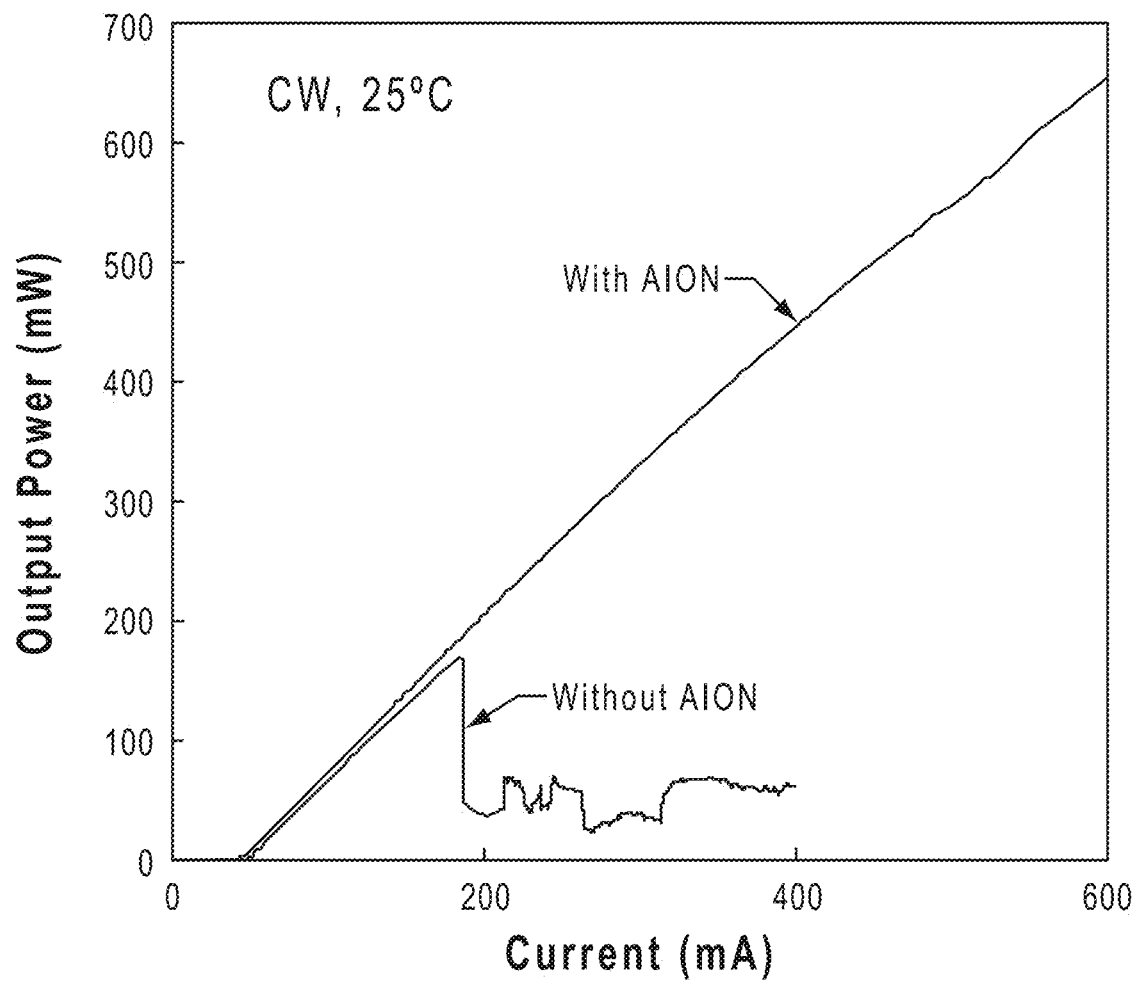
FIG. 5 shows an example from the literature (Tamikawa et al., Appl. Phys. Lett., 2009, 95, 031106) demonstrating how the COMD threshold power can be improved by ECR coating with AlON in conventional GaN laser diodes.

FIG. 5 shows an example from the literature demonstrating how the COMD threshold power can be improved by ECR coating in conventional GaN laser diodes.

Figure 6:
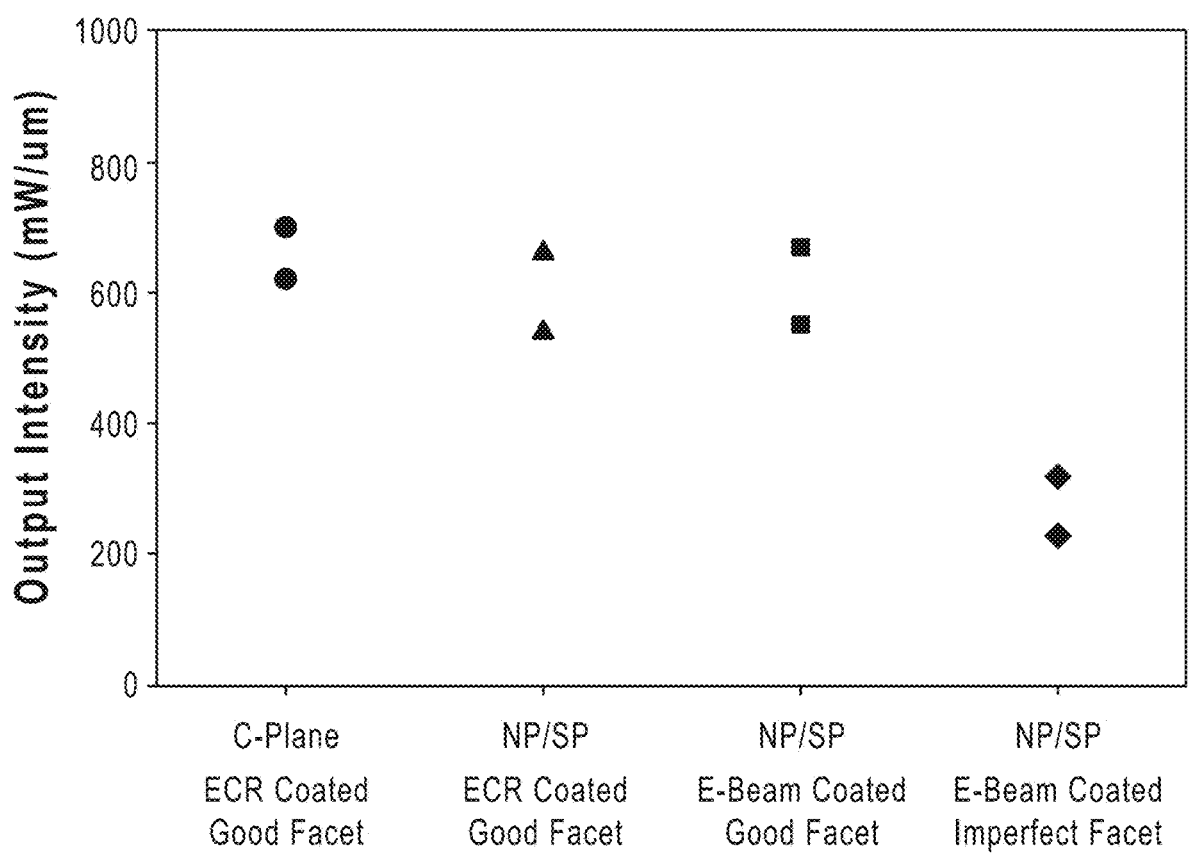
FIG. 6 shows experimental COMD level data for commercially available c-plane (-Plane) laser diodes having AlGaN claddings and ECR facet coatings, and for nonpolar/semipolar (NP/SP) laser diodes with cladding layers substantially free from Al-containing claddings and using conventional e-beam facet coating (E-Beam Coated) techniques in an example.

FIG. 6 shows experimental COMD level data for commercially available c-plane laser diodes having AlGaN claddings and ECR facet coatings, and for nonpolar/semipolar laser diodes with cladding layers substantially free from Al-containing claddings and using conventional e-beam facet coating techniques. As seen in the figure, with good facet quality, the e-beam coated nonpolar/semipolar devices can achieve the same power level before COMD as the c-plane or nonpolar/semipolar devices using the more specialized ECR coating technique. However, when imperfections are introduced to the facet, the COMD level is substantially reduced.

Figure 7A:
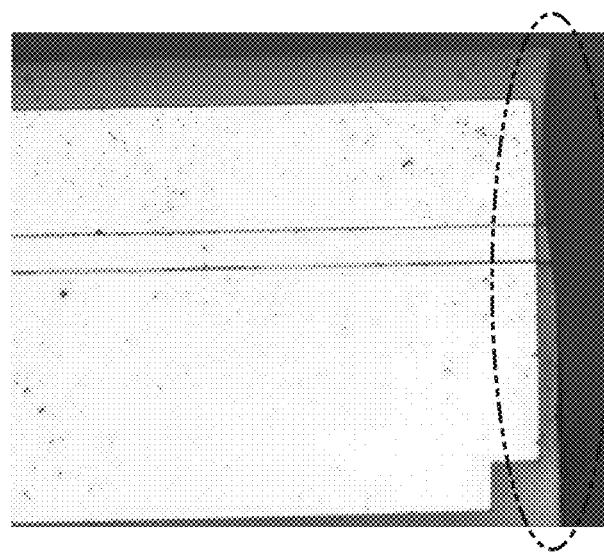
FIGS. 7A and 7B show examples of facet imperfections resulting from a cleaving process on nonpolar/semipolar laser diode facets in an example.
Figure 7B:
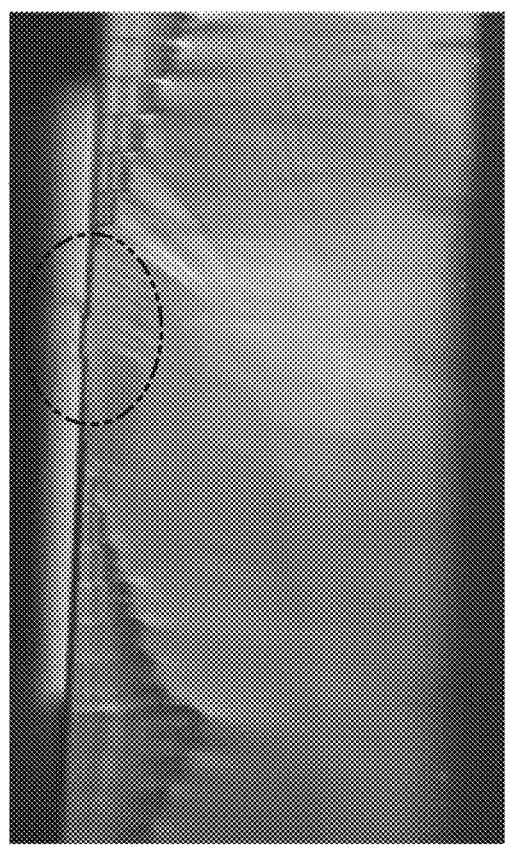

FIGS. 7A and 7B shows examples of facet imperfections resulting from a cleaving process on nonpolar/semipolar laser diode facets. Such imperfections can act as initiation sites for catastrophic failure and lead to low COMD levels and hence device failures. FIG. 7A shows a top view image of an imperfect facet and FIG. 7B shows an end view image of an imperfect facet.

Figure 8A:
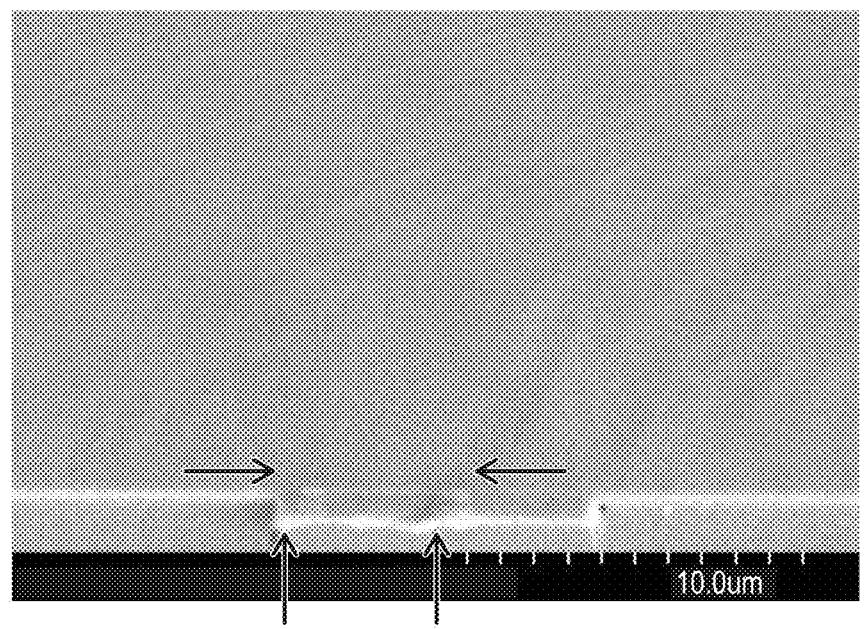
FIGS. 8A and 8B show an SEM image and an optical image, respectively, of facet failures related to imperfections from the cleaving process where the arrows depict the failure points and the imperfections in an example.
Figure 8B:
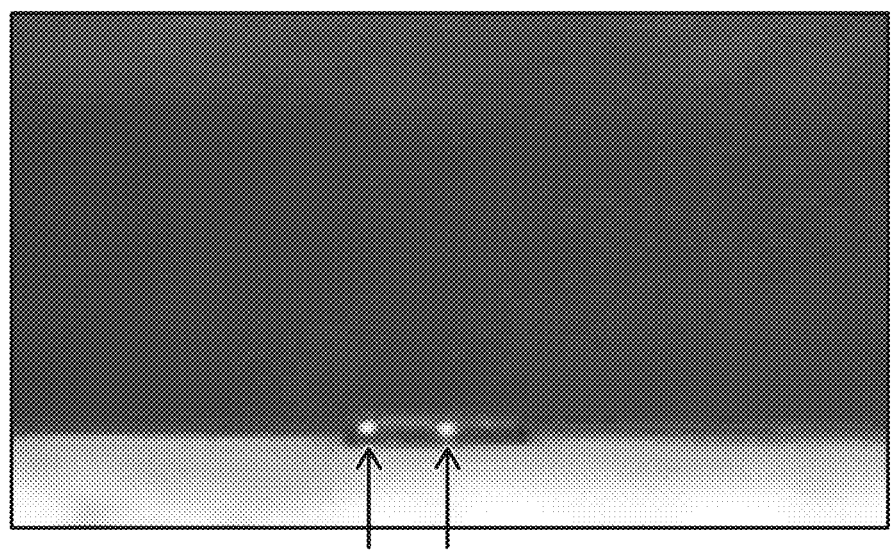

FIGS. 8A and 8B show an SEM image and an optical image, respectively, of facet failures related to imperfections from the cleaving process where the arrows depict the failure points and the imperfections.

Figure 9:
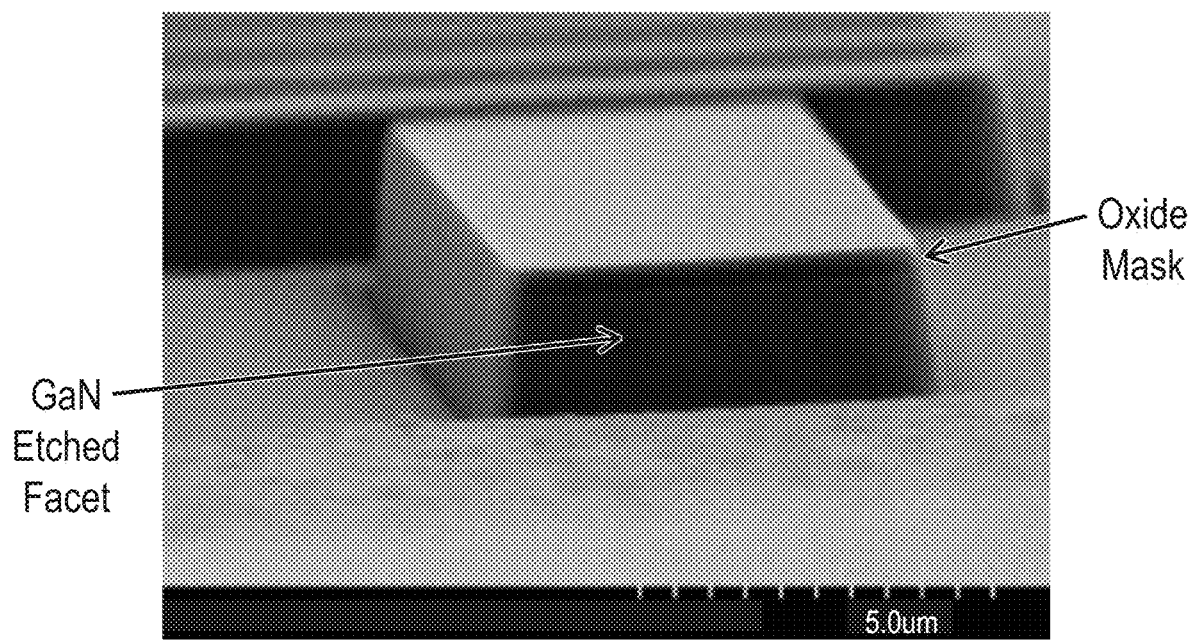
FIG. 9 shows an example taken from the literature (Behfar et al.) of etched facet technology that can yield smooth, vertical, and defect free etched facets to enable very high COMD levels in an example.

FIG. 9 shows an example taken from literature of etched facet technology which can yield smooth, vertical, and defect free etched facets to enable very high COMD levels.

Figure 10:
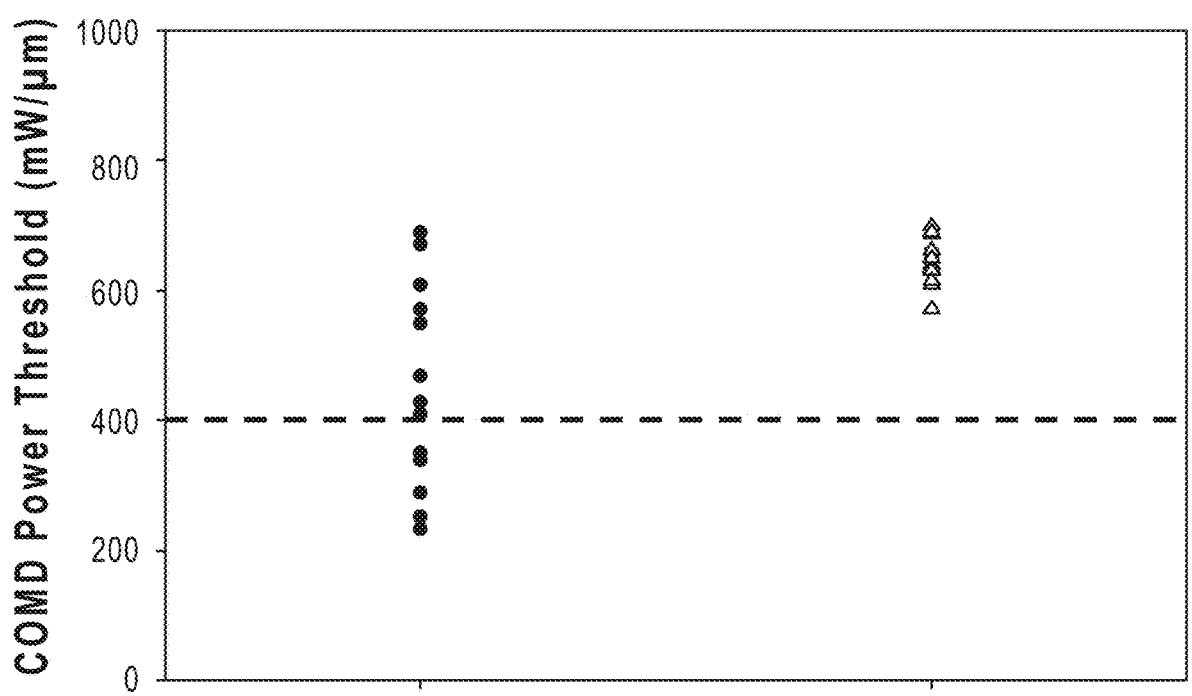
FIG. 10 shows example data demonstrating how etched facets technology can improve the COMD yield compared to etched facet technology on nonpolar or semipolar laser diodes with front facet coatings in an example.

FIG. 10 shows example data demonstrating how etched facets technology could improve the COMD yield compared to etched facet technology on nonpolar or semipolar laser diodes with front facet coatings. Because the quality of a cleaved varies, the COMD power threshold is scattered due to the varied occurrences of imperfections. With the etched facet process, the COMD threshold power levels are tightly distributed due to the lack of cleave associated imperfections, and meet the COMD power requirements for certain applications as indicated by the dashed line of 400 mW/μm.

Catastrophic optical damage (COD) takes places suddenly during operation which is concomitant with high optical power density. Although COD could occur at defects in the bulk of the laser resonator, it occurs mainly at laser facet surfaces (catastrophic optical mirror damage—COMD). The physical origin of this mirror facet failure is due to the fact that when a laser facet is formed by conventional cleaving or other chemical methods, a set of the unsaturated bonds appear at the exposed surface. These dangling bonds interact strongly with atoms and molecules of the ambient, forming non-negligible surface states. Strong facet heating occurs through surface nonradiative recombination and surface current effects mediated by surface states, and can be detrimental to the performance and reliability of diode lasers, in particular regarding the optical integrity of their facet mirrors.

Although the surface recombination velocity of GaN is about two orders lower than that of a GaAs facet, GaN lasers are still prone to facet failure when operated at high optical power density. In order to mitigate this facet failure and improve the performance and reliability of GaN lasers, mirror facet surface passivation is necessary to reduce the number of surface states and hence the recombination velocity.

There are several methods of formation of high quality passivation layers, such as atomic layer deposition (ALD), electron cyclotron resonance (ECR) plasma deposition, EMOF (epitaxial mirror on facet) deposition by molecular beam epitaxy (MBE), and MOCVD.

ALD is a vapor phase technique capable of producing thin films of a variety of materials. Based on sequential, self-limiting reactions, ALD offers exceptional conformality on high-aspect ratio structures, thickness control at the Angstrom level, and tunable film composition. With these advantages, ALD has emerged as a tool for many industrial and research applications. It consists of sequential alternating pulses of gaseous chemical precursors that react with the substrate. Typically, ALD processes are conducted at temperatures of <350° C. Although ALD has many promising features, it also suffers from slow deposition rates. Because of the long cycle times involved in pulsing and purging precursors and the layer-by-layer nature of the deposition, most ALD rates are on the order of 100-300 nm/h.

EMOF process is a process that involves a facet cleaving process under vacuum, followed by mirrors grown from a wide-bandgap semiconductor that is lattice-matched to the laser material to provide an interface with minimal defects. This wide-bandgap material is grown by MBE at low temperatures. MBE growth enables control of the mirror thickness, which translates to control of reflectivity. Because the EMOF deposition is a batch process, and because the MBE provides good process control, EMOF deposition can enable inexpensive volume production of lasers materials with facet passivation technology that yielded high COMD power and long term reliability.

Figure 11:
FIG. 11 shows an example of an electron cyclotron resonance (ECR) plasma deposition tool, a model AFTEX-6200 manufactured by MES-AFTY.

Another method is ECR plasma deposition. FIG. 11 shows an example of an ECR deposition tool, a model AFTEX-6200 manufactured by MES-AFTY. High speed electrons collide with gas molecules, which generate a high density plasma. Low energy and high density ion irradiation can provide high quality films. Prior to film deposition, a plasma cleaning process can be used in some embodiments either in-situ or in another tool.

Figure 12:
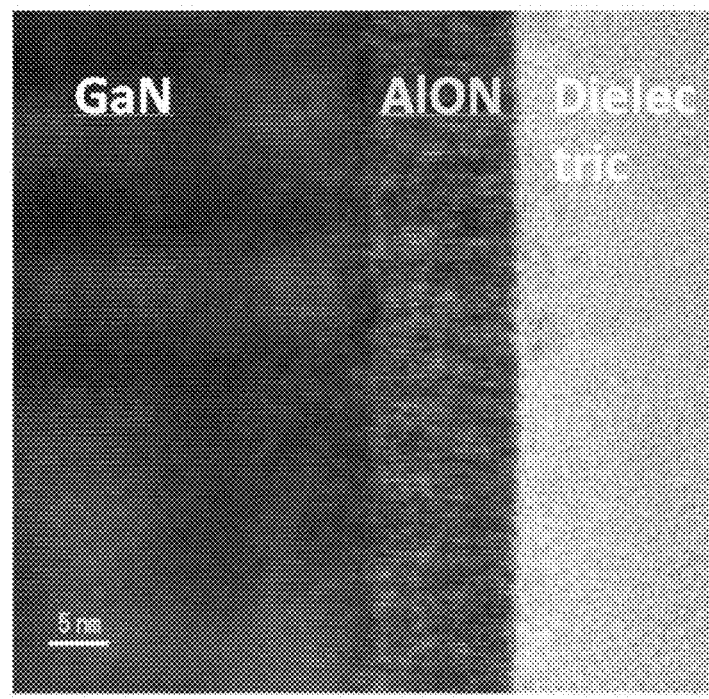
FIG. 12 shows a TEM image of an AlON passivation layer epitaxially grown on a GaN interface according to an embodiment.
Figure 11:
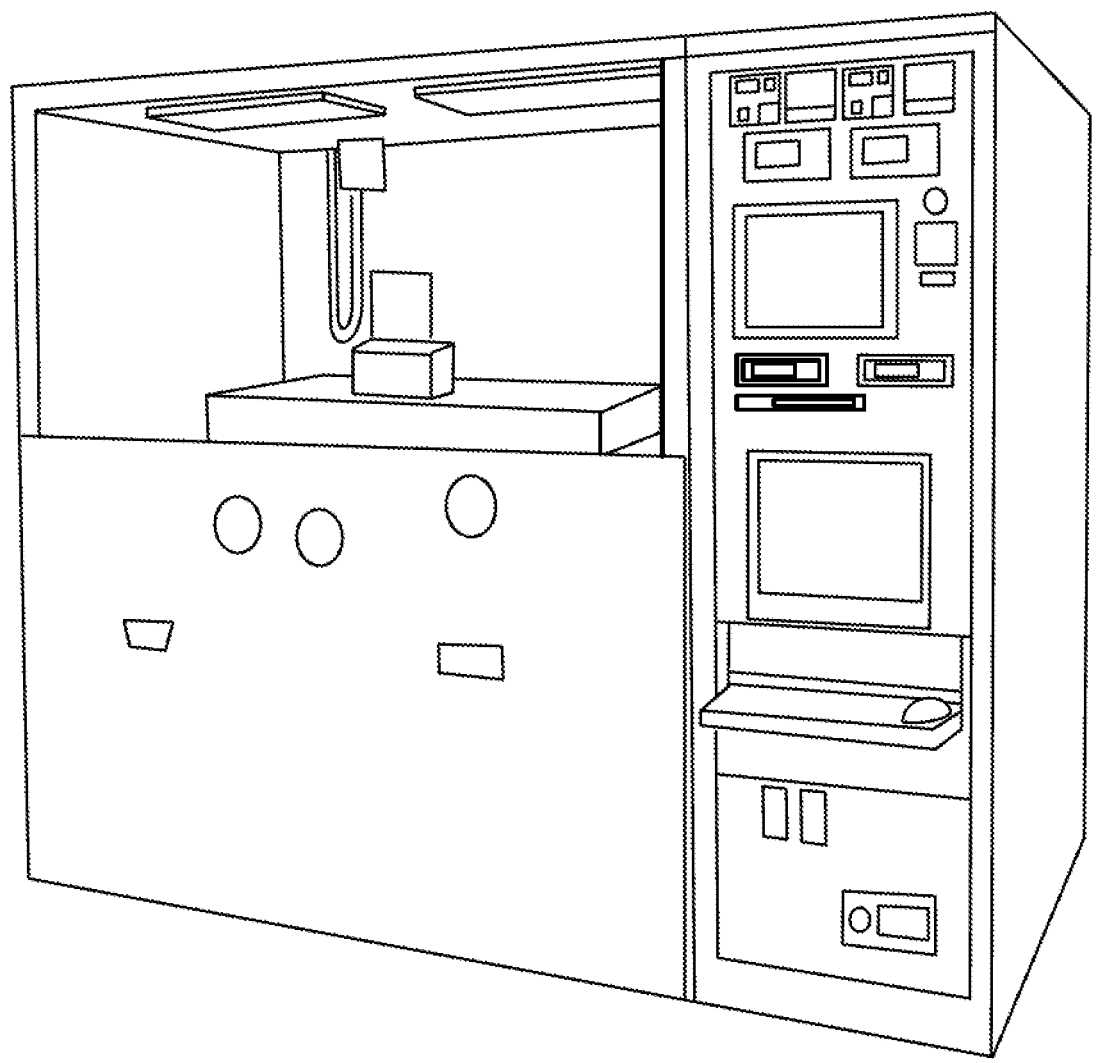
Figure 12:
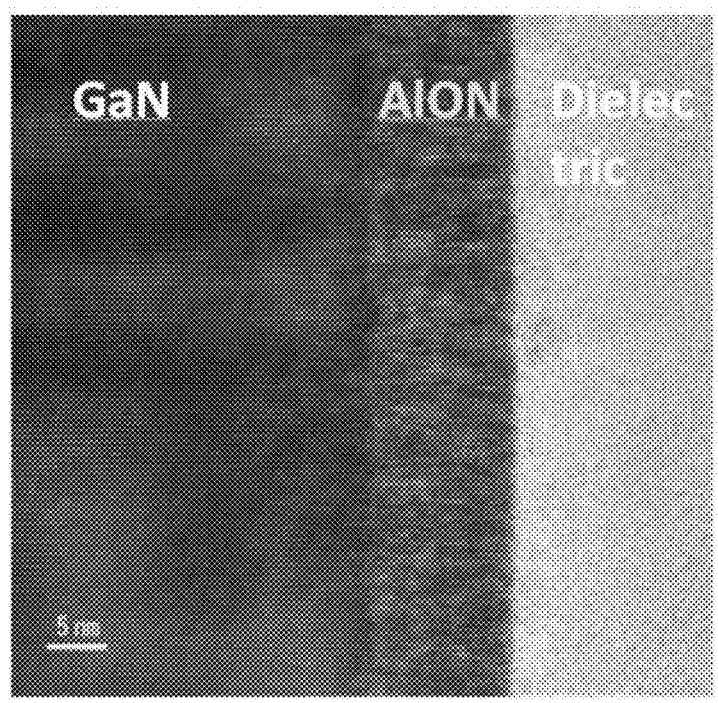
Figure 13:
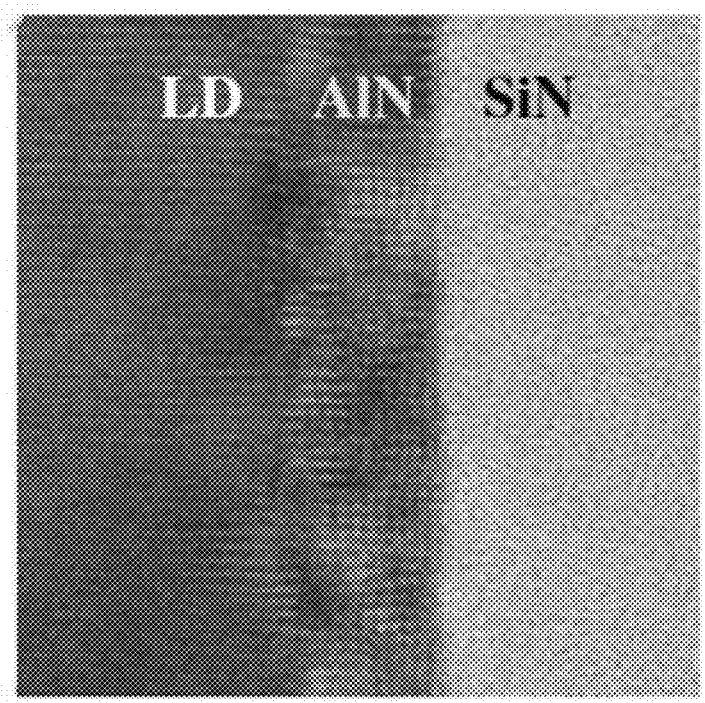
FIG. 13 shows a TEM image of an AlN passivation layer epitaxially grown on a GaN interface according to an embodiment.
Figure 14:
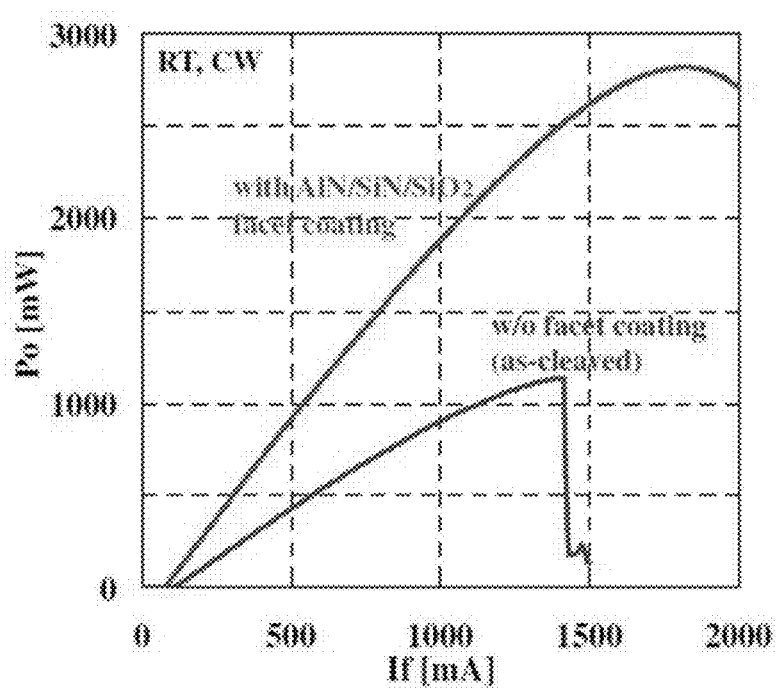
FIG. 14 shows that COMD power can be improved by more than 2× with an AlN passivation layer in accordance with an embodiment.

Several materials could be used for the passivation layer for GaN laser diodes, such as AlN, AlON, and/or AlO. The passivation layer typically has a thickness of 5-15 nm. With optimized plasma cleaning and film deposition processes, high quality crystalline or polycrystalline passivation layers have been demonstrated on GaN facets. FIG. 12 shows a TEM image of an AlON passivation layer epitaxially grown on a GaN interface according to an embodiment, and FIG. 13 shows a TEM image of an AlN passivation layer epitaxially grown on a GaN interface according to another embodiment. Device performance can be improved. FIG. 5 shows an example demonstrating how COMD threshold power can be improved by ECR coating with AlON passivation layer in accordance with an embodiment, and FIG. 14 shows that COMD power can be improved by more than 2× with an AlN passivation layer in accordance with another embodiment. Improved long term reliability has been demonstrated as well.

In an example, a gallium and nitrogen containing laser device configured on either a nonpolar or a semipolar surface orientation. The device has a gallium and nitrogen containing substrate member and a cladding region overlying the substrate member. In an example, the device has a cavity region formed overlying the cladding region and configured in alignment in substantially a c-direction or a projection of the c-direction. Preferably, a cavity region is characterized by a first end and a second end. In an example, the device has a first optical coating formed overlying the first facet, wherein the first coating overlying the first facet is configured to increase a reflectivity and a second optical coating formed overlying the second facet, wherein the second coating layer overlying the second facet is configured to reduce a reflectivity. The device has an optical power density characterizing the laser device, the laser device being substantially free from COMD related failure.

In an example, the nonpolar or semipolar surface orientation comprises an m-plane, a (30-31) plane, a (20-21) plane, a (30-32) plane, a (30-3-1) plane, a (20-2-1) plane, a (30-3-2) plane, or an offcut of within +/−5 degrees of any of these planes toward an a-direction or a c-direction; the cladding region being substantially free from Al-containing material, the cladding region being characterized by an AlN mol fraction in the cladding region of less than about 2%. In an example, the first optical coating is provided by a method selected from electron-beam deposition, thermal evaporation, PECVD, sputtering, and a combination of any of the foregoing. In other examples, the present invention also includes related methods reciting the same or similar elements.

In an example, the device comprises an output cavity width of greater than about 3 µm and less than about 25 µm, and is operable at over 1W or wherein the device comprises an output cavity width of greater than about 3 µm and less than about 25 µm and is operable at over 2W or wherein the device comprises an output cavity width of greater than about 3 µm and less than about 35 µm, and is operable at over 3W or wherein the device comprises an output cavity width of greater than about 3 µm and less than about 35 µm, and is operable at over 4.5W or wherein the device comprises an output cavity width of greater than about 3 µm and less than about 50 µm and is operable at over 3W. In an example, the device is substantially free from COMD for power levels greater than 100 mW per micron of output cavity width, 200 mW per micron of output cavity width, or 400 mW per micron of output cavity width.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above toward an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above toward an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. application Ser. No. 12/789,303 filed on May 27, 2010, which is incorporated by reference in its entirety.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed on May 27, 2010, which claims priority to U.S. Provisional Application Nos. 61/182,105 filed on May 29, 2009, and 61/182,106 filed May 29, 2009, each of which is incorporated by reference in its entirety.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. A gallium and nitrogen containing laser device, comprising:
   a gallium and nitrogen containing surface having either a nonpolar orientation or a semipolar orientation;
   a cladding region substantially free from aluminum containing species overlying the gallium and nitrogen containing surface;
   a cavity region overlying the gallium and nitrogen containing surface, the cavity region aligned substantially in a c-direction or a projection of the c-direction, the cavity region characterized by a first end and a second end, the first end comprising a first c-face etched facet and the second end comprising a second c-face etched facet, wherein the first etched facet and the second etched facet are at an angle of between 87 degrees and 93 degrees from the gallium and nitrogen containing surface;
   a first optical coating overlying the first c-face etched facet, wherein the first optical coating is configured to increase a reflectivity of the first c-face etched facet to a laser beam generated in the cavity region; and
   a second optical coating overlying the second c-face etched facet, wherein the second optical coating is configured to enable emission of the laser beam from the second c-face etched facet, the second optical coating including a first crystalline layer consisting essentially of AlN and a second amorphous layer, wherein the first crystalline layer directly contacts the entire second c-face etched facet and is configured as a passivation layer, and the second amorphous layer directly contacts the first crystalline layer, the second optical coating having a substantially uniform thickness across the second c-face etched facet.

2. The device of claim 1, wherein the nonpolar orientation or the semipolar orientation of the gallium and nitrogen containing surface comprises at least one of an m-plane, a (30-31) plane, a (20-21) plane, a (30-32) plane, a (30-3-1)

plane, a (20-2-1) plane, a (30-3-2) plane, or an offcut of within +/−5 degrees of any of these planes toward an a-direction or a c-direction.

3. The device of claim 1, wherein the device is operable at a wavelength from 430 nm to 480 nm.

4. The device of claim 1, wherein the device is operable at a wavelength from 480 nm to 535 nm.

5. The device of claim 1, wherein the device is operable at a wavelength from 390 nm to 430 nm.

6. The device of claim 1, wherein the second amorphous layer comprises AlO.

7. A gallium and nitrogen containing laser device, comprising:
   a gallium and nitrogen containing surface having either a nonpolar orientation or a semipolar orientation;
   a cladding region overlying the gallium and nitrogen containing surface;
   a cavity region overlying the gallium and nitrogen containing surface, the cavity region aligned in substantially a c-direction or a projection of the c-direction, the cavity region characterized by a first end and a second end, the first end comprising a first c-face etched facet and the second end comprising a second c-face etched facet;
   a first optical coating overlying the first c-face etched facet, wherein the first optical coating is configured to increase a reflectivity of the first c-face etched facet to a laser beam generated in the cavity region; and
   a second optical coating overlying the second c-face etched facet, wherein the second optical coating is configured to enable emission of the laser beam from the second c-face etched facet, the second optical coating including a first crystalline layer consisting essentially of AlN and a second amorphous layer of AlO, wherein the first crystalline layer directly contacts the entire second c-face etched facet and is configured as a passivation layer, and the second amorphous layer directly contacts the first crystalline layer, the second optical coating having a substantially uniform thickness across the second c-face etched facet.

8. The device of claim 7, wherein the nonpolar orientation or the semipolar orientation of the gallium and nitrogen containing surface comprises an m-plane, a (30-31) plane, a (20-21) plane, a (30-32) plane, a (30-3-1) plane, a (20-2-1) plane, a (30-3-2) plane, or an offcut of within +/−5 degrees of any of these planes toward an a-direction or a c-direction.

9. The device of claim 7, wherein the second amorphous layer of AlO is $Al_2O_3$.

10. The device of claim 7, wherein the first optical coating comprises $Al_2O_3$.

11. The device of claim 7, wherein the device comprises an output cavity width of greater than about 3 μm and less than about 25 μm and is operable at an output power over 1 W, or wherein the device comprises an output cavity width of greater than about 3 μm and less than about 35 μm and is operable at an output power over 3 W, or wherein the device comprises an output cavity width of greater than about 3 μm and less than about 50 μm and is operable at an output power over 3 W.

12. The device of claim 7, wherein the first c-face etched facet and the second c-face etched facet are at an angle of between 87 degrees and 93 degrees from the gallium and nitrogen containing surface, and the first c-face etched facet and the second c-face etched facet have a root mean square roughness of 50 nm or less.

13. The device of claim 7, wherein the device is operable at a wavelength from 430 nm to 480 nm.

14. The device of claim 7, wherein the device is operable at a wavelength from 480 nm to 535 nm.

15. The device of claim 7, wherein the device is operable at a wavelength from 390 nm to 430 nm.

16. A method of fabricating a gallium and nitrogen containing laser device, the method comprising:
   providing a gallium and nitrogen containing surface having either a nonpolar orientation or a semipolar orientation;
   forming a cladding region overlying the gallium and nitrogen containing surface;
   forming a cavity region overlying the gallium and nitrogen containing surface, the cavity region aligned in substantially a c-direction or a projection of the c-direction, the cavity region being characterized by a first end and a second end;
   etching the first end of the cavity region to form a first c-face etched facet;
   etching the second end of the cavity region to form a second c-face etched facet;
   forming a first optical coating overlying the first c-face etched facet, wherein the first optical coating is configured to increase a reflectivity of the first c-face etched facet to a laser beam generated in the cavity region; and
   forming a second optical coating overlying the second c-face etched facet by electron cyclotron resonance (ECR) plasma deposition, the second optical coating configured to enable emission of the laser beam from the second c-face etched facet, wherein forming the second optical coating includes:
      cleaning the second c-face etched facet using a plasma cleaning process;
   thereafter
      forming a first crystalline layer consisting essentially of AlN, wherein the first crystalline layer has a thickness of between about 5 nm to 15 nm, directly contacts the entire second c-face etched facet, and is configured as a passivation layer; and
      forming a second amorphous layer of AlO, wherein the second amorphous layer directly contacts the first crystalline layer.

17. The method of claim 16, wherein the first c-face etched facet and the second c-face etched facet are formed using an etching process selected from chemical assisted ion beam etching (CAIBE), reactive ion etching, inductively coupled plasma etching, and chemical assisted ion beam etching.

18. The method of claim 16, further comprising operating the laser device at an optical power density of greater than 400 mW per micron of output cavity width without catastrophic optical mirror damage (COMD) related failure.

19. The method of claim 16, wherein the first c-face etched facet and the second c-face etched facet are at an angle of between 87 degrees and 93 degrees from the gallium and nitrogen containing surface, and the first c-face etched facet and the second c-face etched facet have a root mean square roughness of 50 nm or less.

20. The method of claim 16, wherein the second amorphous layer of AlO is $Al_2O_3$.

* * * * *